US011347285B2

(12) United States Patent
Casparian et al.

(10) Patent No.: US 11,347,285 B2
(45) Date of Patent: May 31, 2022

(54) MECHANICALLY-ADJUSTABLE SUPPLEMENTAL COOLING SYSTEMS AND METHODS FOR PORTABLE INFORMATION HANDLING SYSTEMS

(71) Applicant: Dell Products L.P., Round Rock, TX (US)

(72) Inventors: Mark A. Casparian, Miami, FL (US); Philip J. Grossmann, Austin, TX (US); Joe A. Olmsted, Cedar Park, TX (US); Francisco Santana, Miami, FL (US); Charles Cameron Duncan, Austin, TX (US); Frank C. Azor, Palmetto Bay, FL (US)

(73) Assignee: Dell Products L.P., Round Rock, TX (US)

( * ) Notice: Subject to any disclaimer, the term of this patent is extended or adjusted under 35 U.S.C. 154(b) by 126 days.

(21) Appl. No.: 16/437,709

(22) Filed: Jun. 11, 2019

(65) Prior Publication Data

US 2019/0294222 A1    Sep. 26, 2019

Related U.S. Application Data

(62) Division of application No. 15/070,830, filed on Mar. 15, 2016, now Pat. No. 10,416,734.

(51) Int. Cl.
*H05K 7/20* (2006.01)
*G06F 1/20* (2006.01)
(Continued)

(52) U.S. Cl.
CPC .......... *G06F 1/203* (2013.01); *G06F 1/1632* (2013.01); *F24F 13/0209* (2013.01);
(Continued)

(58) Field of Classification Search
CPC .... G06F 1/203; G06F 1/1632; H05K 7/20145
See application file for complete search history.

(56) References Cited

U.S. PATENT DOCUMENTS 5,798,951 A    8/1998  Cho et al.
5,884,049 A    3/1999  Atkinson
(Continued)

OTHER PUBLICATIONS

Grossman et al., "Systems and Methods for Controlling Processing Device Power Consumption" U.S. Appl. No. 14/836,618, filed Aug. 26, 2015, 32 pgs.

(Continued)

*Primary Examiner* — Lionel Nouketcha
(74) *Attorney, Agent, or Firm* — Egan, Enders & Huston LLP.

(57) ABSTRACT

Systems and methods that may be implemented to provide supplemental cooling air for a portable information handling system from one or more mechanically-adjustable cooling air supply outlets that may be positioned and/or repositioned at multiple different locations relative to a portable information handling system, such as notebook computer or laptop computer. In one example, the disclosed systems and methods may be implemented to have one or more mechanically-adjustable cooling air supply outlets that may be positioned and/or repositioned to align with differing geometries of cooling air inlet opening locations that correspond to different portable information handling system sizes and/ or designs.

21 Claims, 15 Drawing Sheets

(51) Int. Cl.
*G06F 1/16* (2006.01)
*F24F 13/02* (2006.01)
*H01L 23/38* (2006.01)
*F24F 13/12* (2006.01)

(52) U.S. Cl.
CPC ........... *F24F 13/0254* (2013.01); *F24F 13/12* (2013.01); *H01L 23/38* (2013.01); *H05K 7/20145* (2013.01)

(56) References Cited

U.S. PATENT DOCUMENTS

| | | | |
|---|---|---|---|
| 5,917,697 A * | 6/1999 | Wang | G11B 33/142 |
| | | | 361/695 |
| 6,023,587 A | 2/2000 | Watts, Jr. et al. | |
| 6,151,646 A | 11/2000 | Watts et al. | |
| 6,522,535 B1 * | 2/2003 | Helot | G06F 1/1632 |
| | | | 165/104.34 |
| 6,744,630 B2 | 6/2004 | Hutchinson | G06F 1/183 |
| | | | 165/120 |
| 6,837,057 B2 * | 1/2005 | Pokharna | G06F 1/203 |
| | | | 361/679.41 |
| 6,845,008 B2 | 1/2005 | Pokharna et al. | |
| 7,301,765 B2 * | 11/2007 | Huang | G06F 1/203 |
| | | | 361/679.48 |
| 7,788,436 B2 | 8/2010 | Mok et al. | |
| 8,000,099 B2 * | 8/2011 | Parker | G06F 1/203 |
| | | | 361/679.48 |
| 8,320,121 B2 | 11/2012 | Bisson et al. | |
| 8,619,419 B2 | 12/2013 | Zimmermann et al. | |
| 9,025,332 B2 | 5/2015 | Campbell et al. | |
| 2003/0005201 A1 | 1/2003 | Olson et al. | |
| 2004/0123977 A1 | 7/2004 | Pokharna et al. | |
| 2005/0073812 A1 * | 4/2005 | Lin | G06F 1/20 |
| | | | 361/695 |
| 2006/0158844 A1 * | 7/2006 | Lee | G06F 1/1632 |
| | | | 361/679.46 |
| 2009/0030644 A1 | 1/2009 | Johns et al. | |
| 2010/0202627 A1 | 8/2010 | Gray | |
| 2011/0085303 A1 | 4/2011 | Peng et al. | |
| 2011/0267769 A1 | 11/2011 | Nakamura et al. | |
| 2012/0327581 A1 | 12/2012 | Pais et al. | |
| 2014/0032011 A1 | 1/2014 | Artman et al. | |
| 2014/0098486 A1 * | 4/2014 | Davis | G06F 1/1607 |
| | | | 361/679.41 |
| 2014/0281618 A1 | 9/2014 | Sultenfuss et al. | |
| 2015/0198957 A1 | 7/2015 | Montero et al. | |
| 2017/0168531 A1 | 6/2017 | Casparian et al. | |
| 2017/0273214 A1 | 9/2017 | Casparian et al. | |

OTHER PUBLICATIONS

Lovicott et al, "Systems and Methods of Adaptive Thermal Control for Information Handling Systems", U.S. Appl. No. 14/664,317, filed Mar. 20, 2015, 56 pgs.

Sierra et al, "Systems and Methods for Orchestrating External Graphics", U.S. Appl. No. 14/523,547, filed Oct. 24, 2014, 67 pgs.

Prendergast et al. "Systems and Methods for Controlling Radio Transmit Power for Information Handling Systems Based on System Specific RF Parameters", U.S. Appl. No. 14/734,453, filed Jun. 9, 2015, 33 pgs.

Cutress, "Asus X99-A Motherboard Review", AnandTech, Dec. 2014, 12 pgs.

Kirsch, "IDF-Hot Gamin Notebooks Get Air Conditioning", Legit Reviews, Sep. 2007, 4 pgs.

* cited by examiner

MECHANICALLY-ADJUSTABLE SUPPLEMENTAL COOLING SYSTEMS AND METHODS FOR PORTABLE INFORMATION HANDLING SYSTEMS

This application is a divisional of U.S. patent application Ser. No. 15/070,830, filed on Mar. 15, 2016 and entitled "Mechanically-Adjustable Supplemental Cooling Systems And Methods For Portable Information Handling Systems" which is incorporated herein by reference in its entirety for all purposes.

FIELD OF THE INVENTION

This application relates to portable information handling systems and, more particularly, to cooling for portable information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As notebook computers are being made increasingly more thin, it is harder to achieve adequate cooling using internal fans within the notebook computer chassis. This is especially true for high performance applications such as computer gaming. External cooling pads have been provided that include one or more cooling fans, and that are designed to be positioned underneath a notebook computer during operation. Such external cooling pads blow ambient air generally upward onto the underside of the notebook computer without regard to the particular location of cooling air inlet openings of a given notebook computer. Therefore, the amount of additional cooling actually provided by such a conventional cooling pad to the internal components of a notebook computer may be very limited. It is also known to provide a custom docking station having fixed and unmovable cooling air outlet apertures that are configured to align with the particular locations of the cooling air inlet openings of a given notebook computer design. Because the number and location of notebook computer air inlet openings vary from one notebook computer design to another, this solution requires a custom docking station configuration for each different notebook computer design.

SUMMARY OF THE INVENTION

Systems and methods are disclosed herein that may be implemented to provide supplemental cooling air for a portable information handling system from one or more mechanically-adjustable cooling air supply outlets that may be positioned and/or repositioned at multiple different locations relative to cooling air inlet opening/s of a portable information handling system, such as notebook computer or laptop computer. In one embodiment, the disclosed systems and methods may be implemented to provide a supplemental cooling system (e.g., cooling dock, chilling dock, cooling pad, etc.) having one or more movable cooling air supply outlets that may be positioned and/or repositioned to align with differing geometries of cooling air inlet opening locations that correspond to different portable information handling system designs and/or sizes. In one exemplary embodiment, a movable cooling air supply outlet may be configured to be infinitely (continuously) adjustable within a range of possible positions, while in another exemplary embodiment a movable cooling air supply outlet may be configured to be adjustable between two or more pre-determined positions.

In a further embodiment, a supplemental cooling system (e.g., such as cooling dock) may be implemented with one or more user-adjustable cooling air supply outlets that allow a user to adjust the location/s of the supplemental cooling air that is output from the supplemental cooling system. Such an embodiment may be so implemented to allow a user to optimally position the cooling air supply outlet/s directly under or otherwise adjacent the particular cooling air inlet location/s of a given portable information handling system design (e.g., which may vary depending on the size, make and model of notebook computer that the particular user owns). In this way, a single supplemental cooling system design (e.g., owned by a common user) may be used to optimally cool many different portable information handling system designs or models, and/or may be used to cool portable information handling systems manufactured by different companies, by allowing the user to adjust the position of cooling air supply outlet location/s of the supplemental cooling air system to ensure that supplemental cooling air is directed into the appropriate cooling air inlet openings of a given notebook computer design.

In one exemplary embodiment, a supplemental cooling system may be configured to allow a user to select between two or more pre-determined cooling air supply outlet positions that each correspond to a location of a respective cooling air inlet opening of a different given portable information handling system design, e.g., so that a user may be allowed to easily adjust the physical position of a supplemental cooling air supply outlet (having an air-conducting aperture defined therein) so that it is aligned adjacent a respective cooling air inlet location corresponding to any one of multiple different portable information handling system designs by positioning the cooling air supply outlet in one of the pre-determined cooling air supply outlet positions. In a further exemplary embodiment, a supplemental cooling system may be provided with an optional actuator (e.g., such as a slidable mechanical lever provided on the side of the supplemental cooling system, or an electric motor or electric solenoid actuator that is responsive to a user command or switch input) to allow a user to adjust the physical position of a cooling air supply outlet between two or more of such pre-determined cooling air supply outlet positions by manipulating or otherwise interacting with the actuator (e.g., via a switch).

In one respect, disclosed herein is a supplemental cooling system, comprising: a chassis configured to mate with different types and/or sizes of portable information handling systems that each have at least one cooling air inlet located in a different location relative to the chassis when mated with the chassis than the at least one cooling air inlet of the other portable information handling systems when mated with the chassis; and at least one movable cooling air supply outlet coupled to provide supplemental cooling air. The movable cooling air supply outlet may be configured to be adjustable between multiple different positions relative to the chassis so as to align the movable cooling air supply outlet to provide the supplemental cooling air to the different cooling air inlet locations of the different sizes and/or types of mated information handling systems.

In another respect, disclosed herein is a method of cooling an information handling system, comprising: mating a chassis enclosure of a portable information handling system having at least one cooling air inlet defined therein with a supplemental cooling system having at least one movable cooling air supply outlet coupled to a chassis of the supplemental cooling system; adjusting a position of the movable cooling air supply outlet of the supplemental cooling system relative to the chassis so that the movable cooling air supply outlet is aligned with a location of the cooling air inlet of the mated portable information handling system; and then providing supplemental cooling air from the cooling air supply outlet of the supplemental cooling system to the cooling air inlet of the portable information handling system while operating an internal cooling fan of the portable information handling system to draw in the supplemental cooling air.

DESCRIPTION OF ILLUSTRATIVE EMBODIMENTS

Figure 1A:
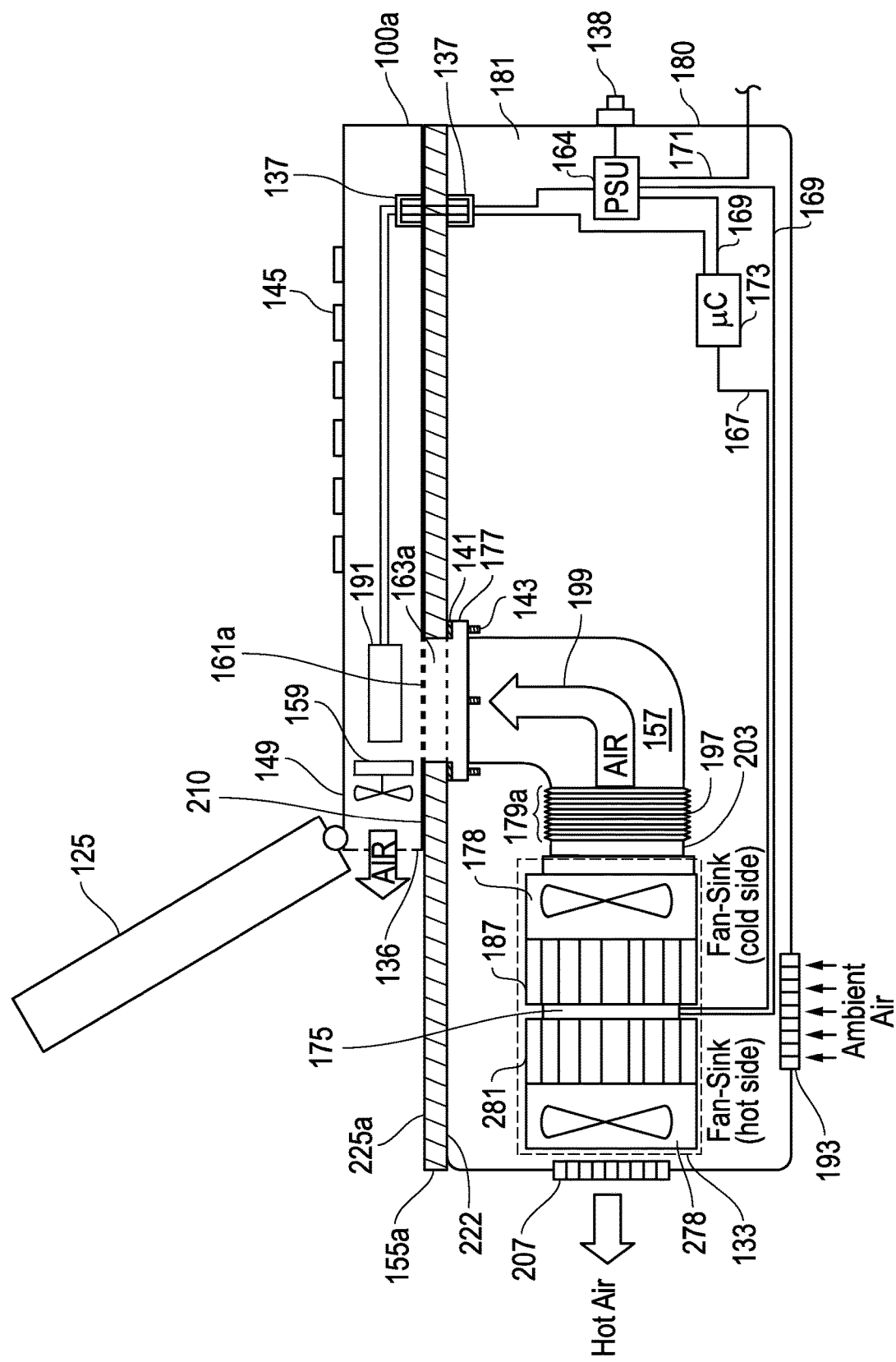
FIG. 1A illustrates a side partial cross-sectional view of a supplemental cooling system and portable information handling system configured in operable relationship according to one exemplary embodiment of the disclosed systems and methods.
Figure 1B:
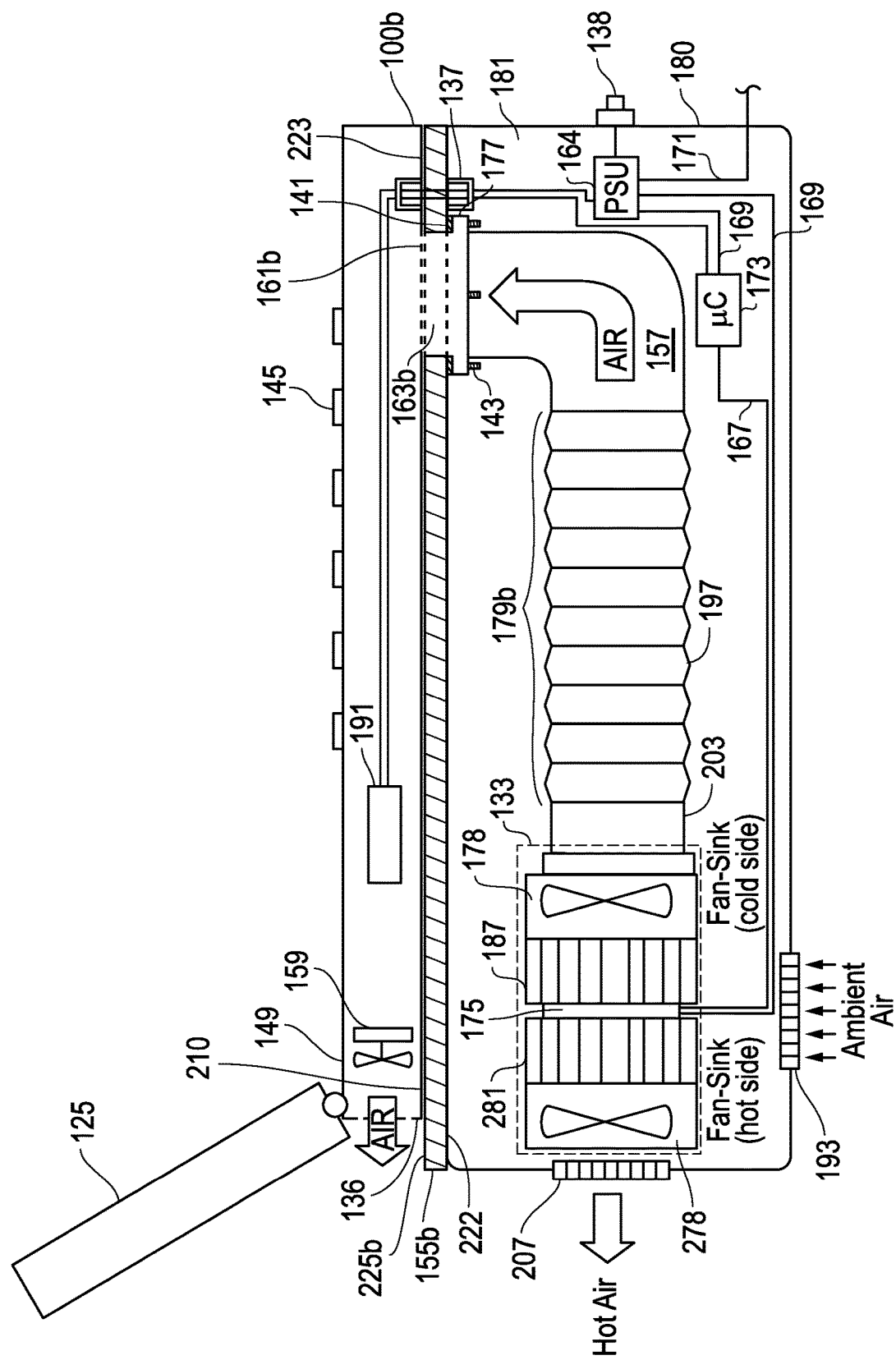
FIG. 1B illustrates a side partial cross-sectional view of a supplemental cooling system and portable information handling system configured in operable relationship according to one exemplary embodiment of the disclosed systems and methods.

FIGS. 1A and 1B illustrate one exemplary embodiment of a supplemental cooling system 180 that is positioned to selectably provide supplemental cooling air to different air inlet locations 161a and 161b of different geometry and/or different size information handling systems 100a and 100b that in the illustrated embodiment are each configured as a notebook or laptop computer. It will be understood that in one embodiment a supplemental cooling system 180 may be optionally configured as a cooling dock to mate with a portable information handing system 100, e.g., using optional mechanical latch features and/or electrical interconnects or connectors 137 which may be configured to mechanically latch or attach the portable information handling system 100 mechanically to the dock and with the dock being optionally driven by an AC/DC adapter and/or providing additional I/O ports (i.e. USB, audio, etc.). The mechanical latch features and/or electrical interconnects or connectors 137 may be configured to mechanically index the portable information handling system 100 in proper orientation relative to the supplemental cooling system 180 to receive supplemental cooling air from the supplemental cooling system 180 as described further herein. The mechanical latch features and/or electrical interconnects or connectors 137 may also include a connector on the underside of a removable lid 155 that is configured to provide a removable connection between electrical components within cooling system 180 and corresponding electrical interconnects or connectors 137 provided on the top side of the removable lid 155, i.e., in order to allow different lids 155 to be interchanged and connected between electrical components within cooling system 180 and electrical components within information handling systems 100 using electrical interconnects or connectors 137.

In another embodiment, a supplemental cooling system 180 may be configured as a portable cooling pad upon which a portable information handling system 100 may mate by resting on the on the supplemental cooling system 180 without interconnects or connectors 137 to receive supplemental cooling air from supplemental cooling system 180, e.g., with optional visual indexing to assist a user in properly orienting the portable information handling system 100 on the supplemental cooling system 180 to receive supplemental cooling air from the supplemental cooling system 180 as described further herein and/or with an optional USB connection or other type power input port of the portable information handling system 100 configured to be coupled to a power output port (e.g., USB) of the portable information handling system 100.

Each of portable information handling systems 100*a* and 100*b* have a chassis enclosure 149 (e.g., outer notebook plastic and/or metal case that surrounds the notebook computer electrical components) with air inlet opening 161 in the chassis enclosure 149 to allow cooling air to be drawn into and circulated through the chassis enclosure 149 by the internal notebook cooling fan/s 159 for dissipating or otherwise transferring heat from heat-producing components 191, e.g., via a heat sink that is thermally coupled to heat-producing components 191 such as one or more processing device/s like CPU, GPU, power supply unit/s, etc.). It will be understood that multiple inlet vents 161 and outlet vents 136 may be defined at different locations within chassis enclosure 149, and/or that one or more internal notebook cooling fans 159 may be provided adjacent an inlet opening 161 and/or an outlet vent 136. Moreover, one or more internal cooling fans 159 may be optionally mounted to directly direct cooling air onto a heat sink/s within chassis enclosure 149. Other components of a portable information handling system 100 may include hinged display lid 125 and keyboard 145.

In the embodiment of FIGS. 1A and 1B, supplemental cooling system 180 is physically configured as a base or stand having different interchangeable lids 155*a* and 155*b* (shown in perspective in FIGS. 2 and 3) upon which a respective notebook computer 100*a* or notebook computer 100*b* may rest or otherwise mate during operation with a respective notebook computer air inlet 161*a* or 161*b* positioned adjacent and above an air-conducting aperture of at least one movable cooling air supply outlet 177 of supplemental cooling system 180 to receive supplemental cooling air from cooling air supply outlet 177 through a corresponding lid opening 163*a* or 163*b* as shown. In this embodiment, 180 is also provided with a supplemental cooling air supply source 133 that includes an air chilling system 175 (e.g., such as thermoelectric cooler module "TEM" or "TEC", vapor compression refrigeration device, absorption refrigeration device, liquid/gas refrigeration system, evaporative cooling, etc.) that is coupled between a hot-side heat sink 281 and a cold side heat sink 187 to allow ambient temperature air to be drawn in at cooling system air inlet 193 by cold side cooling fan 178 and cooled by cold side heat sink 187 to a sub-ambient temperature as it is provided to movable cooling air supply outlet 177 in a manner described further herein. As illustrated, an optional interior lid connector 239 may be provided for cooling dock embodiments that allows for connection and disconnection of electrical components within cooling dock 180 to interconnects or connector 137 of different interchangeable lids 155.

In one embodiment, the supplemental cooling air may be cooled to a temperature that is less than the available external ambient temperature air that surrounds the supplemental cooling system 180 and the chassis enclosure 149 of the portable information handling system 100, and in one exemplary embodiment that is at least 10° F. cooler than the available ambient temperature air incoming through the cooling system air inlet 193, and alternatively that is from about 10° F. to about 30° F. cooler than the available ambient temperature air incoming through the cooling system air inlet 193. At the same time, hot side cooling fan 278 circulates ambient temperature air that is drawn in at cooling system air inlet 193 across hot side heat sink 281 and out hot air outlet 207 to exhaust heat generated by chilling system 175. Further information on chilling dock configurations may be found in U.S. patent application Ser. No. 14/965,186 filed Dec. 10, 2015, which is incorporated herein by reference in its entirety for all purposes.

Figure 5:
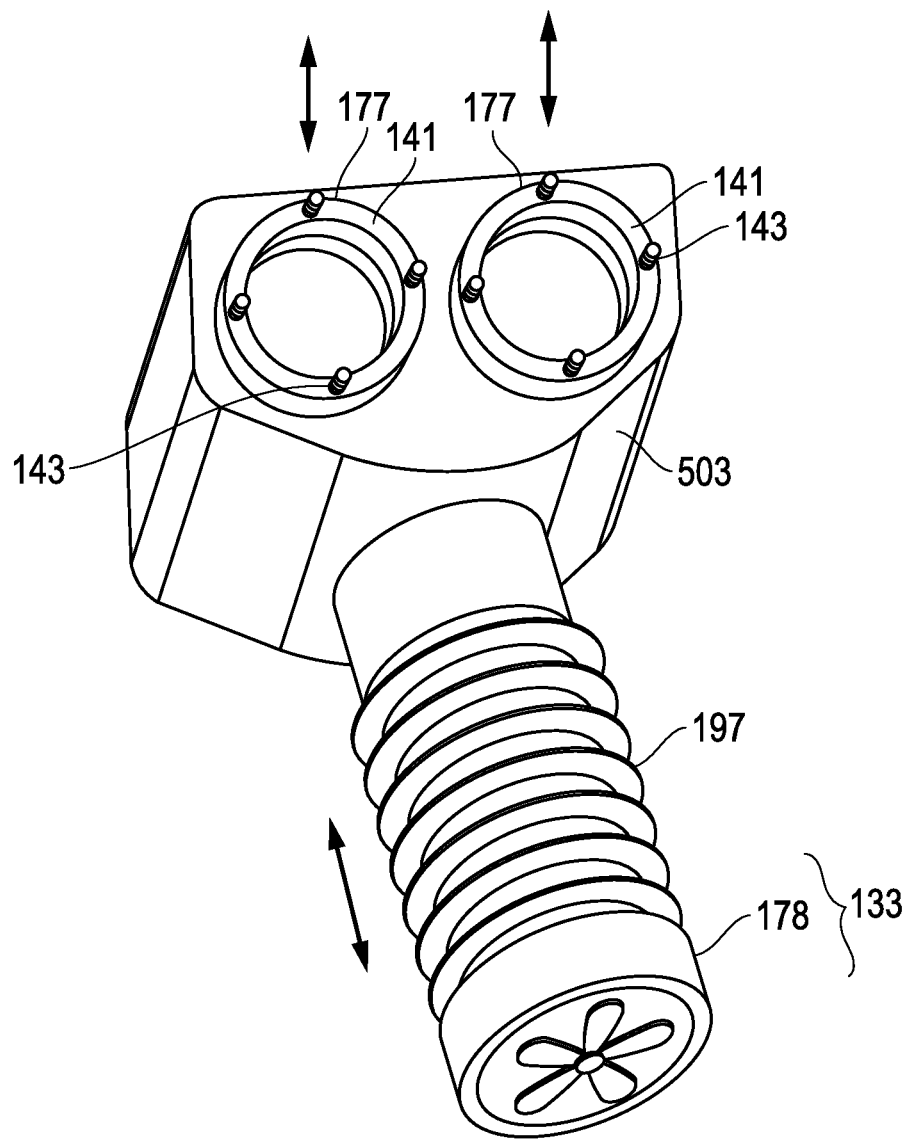
FIG. 5 illustrates a perspective view of a supplemental cooling air source and movable cooling air supply outlets according to one exemplary embodiment of the disclosed systems and methods.

It will be understood that the particular combination of chilling system components illustrated in FIGS. 1A and 1B is exemplary only, and that a supplemental cooling air supply source 133 may be configured in any other manner that is suitable for providing chilled or non-chilled supplemental cooling air to one or more movable cooling air supply outlets 177. For example in one exemplary embodiment, a non-chilled supplemental cooling air source 133 may be provided with no air chilling components, but only a circulating fan 178 that is configured to draw in ambient air at cooling system air inlet 193 and provide unchilled ambient-temperature air as supplemental cooling air to movable cooling air supply outlets 177, e.g., as shown in FIG. 5.

In the illustrated embodiment of FIGS. 1A and 1B, supplemental cooling air source 133 may be mechanically coupled and secured to a chassis 181 in fixed relationship, e.g., using fastener technology such as nuts and bolts, adhesive, spot welding, etc. Chassis 181 may be configured in any suitable form for receiving and/or mating with different types and/or sizes of portable information handling systems 100 and for mechanically supporting supplemental cooling air source 133 and movable cooling air supply outlet/s 177 in operable relationship with a given portable information handling system 100 so as to allow supplemental cooling air source 133 to supply supplemental cooling air to air inlet opening/s 161 of the portable information handling system via one or more movable cooling air supply outlets 177 of the supplemental cooling system 180. In this regard, chassis 181 may be configured as an enclosure, or may be at least partially open (e.g., such as being configured in the form of a rigid plastic, composite and/or metal frame).

Still referring to FIGS. 1A and 1B, supplemental cooling air source 133 may be configured to provide supplemental cooling air 199 through a conduit adapter 203 coupled to at least one mechanically-adjustable air supply conduit in the form of a flexible and repositionable cooling air supply conduit 197 (e.g., flex pipe) and right angle elbow conduit (e.g., PVC) fitting 157 to at least one movable mechanically-adjustable cooling air supply outlet 177 which may be selectably aligned with the location of either one of differently positioned lid openings 163*a* or 163*b* defined in one of interchangeable lids 155*a* and 155*b* that corresponds in position to one of notebook/laptop computer air inlets 161*a* or 161*b* as shown. In this regard, interchangeable lids 155*a* and 155*b* may be of any suitable construction (e.g., plastic, metal, fiberglass, etc.) that is configured to be secured to a main body chassis 181 of supplemental cooling system 180 via any suitable fastening technique (e.g., such as removable screws, plastic tongue and groove snap fittings, etc.) so as to allow the different lids 151*a* and 151*b* to be selectably attached to chassis 181 of supplemental cooling system 180 (e.g., by a user) according to the particular different sized notebook computer 100*a* or 100*b* that is to be docked or otherwise mated to supplemental cooling system 180 to receive supplemental cooling air through its corresponding cooling air inlet 161 from movable cooling air supply outlet 177. In one exemplary embodiment, an upper surface 225 of lid 155 may be optionally rubberized or otherwise textured to form an air seal with the underside 210 of notebook computer 100 around the periphery of an aligned lid opening 163 and air inlet 161. It will also be understood that a removable interchangeable lid 155 need not be solid, but may have one or more openings defined therein (e.g., to reduce weight), and/or may be dimensioned and configured to only partially cover the open internal space within a cooling system chassis 181, e.g., with the remaining portion of the internal space being covered by a permanently affixed or separately-removable lid portion/s.

In the embodiment of FIGS. 1A and 1B, each cooling air supply conduit 197 is provided in the form of a flexible and extendable accordion-like corrugated flex pipe 197 (e.g., such as corrugated polyvinyl chloride (PVC) pipe, corrugated metalized pipe, corrugated vinyl pipe, corrugated polyethylene pipe, etc.), it being understood that a repositionable cooling air supply conduit 197 may be any other suitable corrugated or non-corrugated (e.g., smooth-sided) conduit material and/or structure that is flexible and/or extendable so as to allow for mechanical adjustment in the position of a corresponding attached cooling air supply outlet 177 so that it may be aligned with at least two different locations and/or configurations of notebook/laptop computer air inlets 161 as further described below.

In the illustrated embodiment, electronic components of supplemental cooling system 180 may include power supply unit (PSU) 164 coupled to receive power 171 from AC mains and to provide regulated power 169 to fans and chilling system 175 of supplemental cooling air supply source 133, and to optional cooling system controller or other processing device 173 which may be present to provide control signals 167 to control operation of electrical components of supplemental cooling air supply source 133, e.g., in response to measured air chilled temperature and/or user input control fan speed and/or chilled air temperature commands (not shown). A power switch 138 may be present to allow a user to turn power PSU 164 on and off. In one exemplary embodiment, the all or part of the supplemental cooling air path internal to the supplemental cooling system 180 may be thermally isolated (e.g., using thermal insulation material such as fiberglass insulation or foam) to increase or maximize efficiency of cooled air transport to the air inlets 161 of a portable information handing system 100.

Figure 2A:
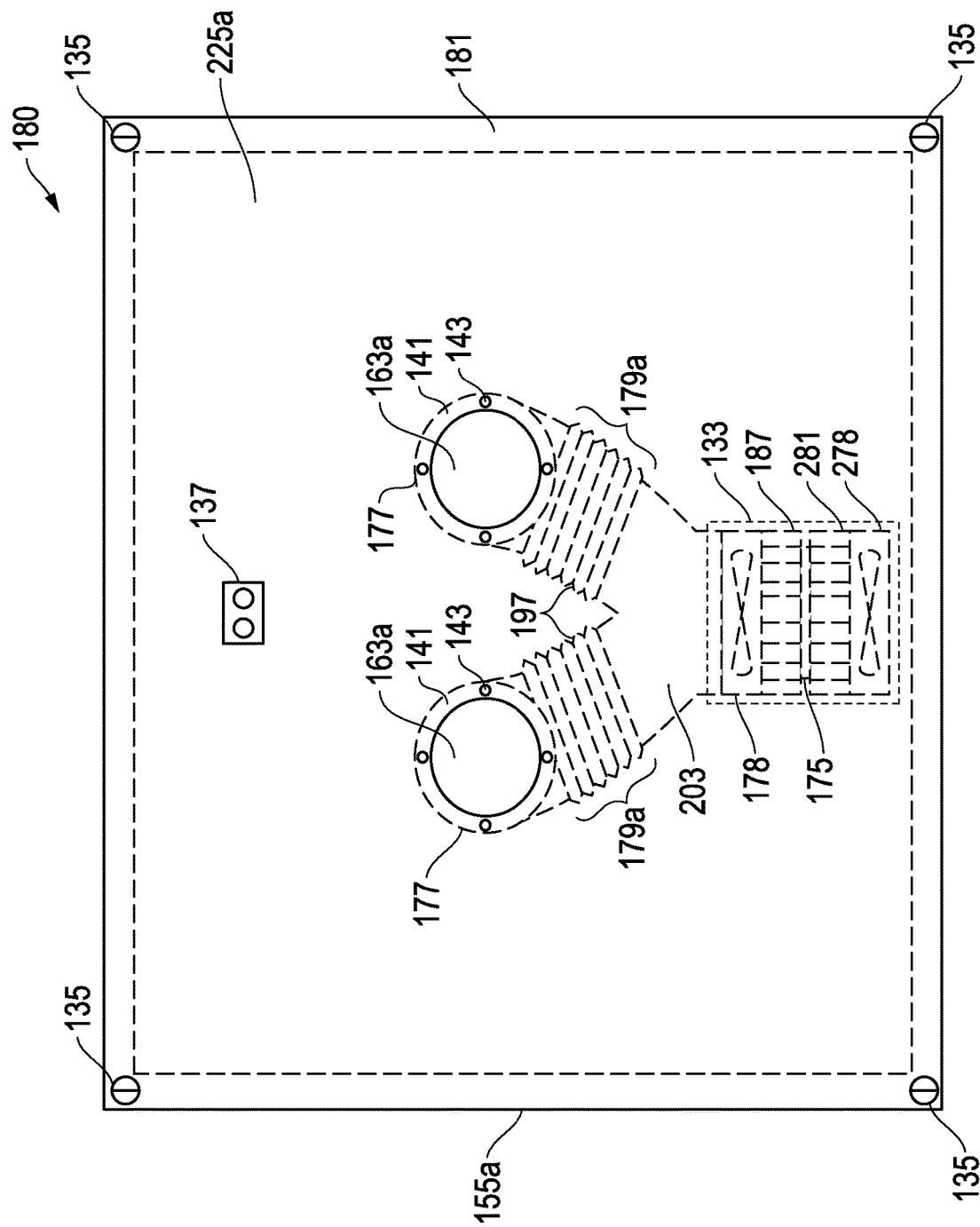
FIG. 2A illustrates an overhead view of a supplemental cooling system according to one exemplary embodiment of the disclosed systems and methods.
Figure 2B:
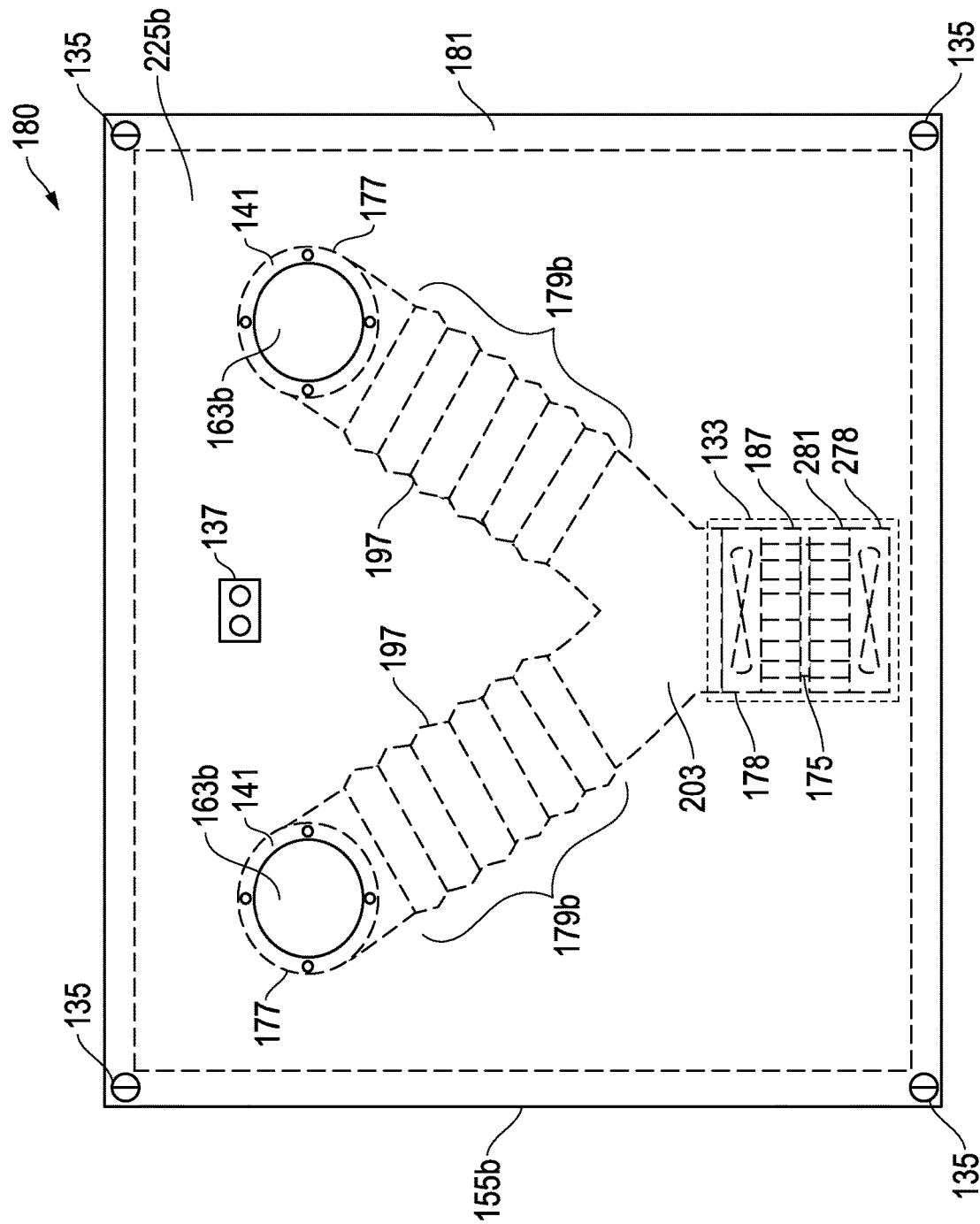
FIG. 2B illustrates an overhead view of a supplemental cooling system according to one exemplary embodiment of the disclosed systems and methods.

As shown in side views of FIGS. 1A and 1B, and corresponding overhead views of respective FIGS. 2A and 2B, position of each of two movable cooling air supply outlet/s 177 of supplemental cooling system 180 may be adjusted between multiple different locations that are adjacent respective lid openings 163*a* and 163*b* of different assembled lids 155*a* and 155*b* while supplemental cooling air supply source 133 remain in an attached fixed position relative to the chassis 181 of supplemental cooling system 180, e.g., so as minimize rattling and vibration. As shown, two movable cooling air supply outlet/s 177 are each coupled to a multiple conduit adapter 203 that is configured to split or divide the supplemental cooling air from cooling air supply source 133 between two cooling air supply conduits 197. As further shown, cooling air supply outlet/s 177 are aligned with lid opening/s 163*a* of lid 155*a* and overlying notebook/laptop computer air inlet/s 161*a* while cooling air supply conduits 197 are in relatively collapsed condition 179*a*, while cooling air supply outlet/s 177 are aligned with lid opening/s 163*b* of different lid 155*b* and overlying notebook/laptop computer air inlet/s 161*b* while cooling air supply conduit/s 197 are in relatively extended condition 179*b*. For example, lid openings 163*a* of lid 155*a* may be configured to align with air inlets 161*a* of a 13 inch notebook computer 100*a*, and lid openings 163*b* of lid 155*b* may be configured to align with air inlets 161*b* of a 17 inch notebook computer 100*b* as shown.

In one embodiment, a user may remove an existing lid 155 from cooling system chassis 181, and then manually move cooling air supply conduit/s 197 between the collapsed and extended positions as appropriate when no lid 155 is installed, before manually attaching the supplemental cooling air supply outlet/s 177 in fixed aligned position relative to lid openings 163 of a given lid 155 and then installing and fastening the given lid 155 to the top 222 of cooling system chassis 181. In the embodiment of FIGS. 1A and 1B, a user may pull-out or press-in the accordion flex pipe conduit 197, before attaching its supply outlet 177 to a new chosen lid 155 that is configured for a new size of portable information handling system 100. In this regard, each of supply outlets 177 may be configured to securely connect to a cooling system lid 155 via a fastener 143 (e.g., self-threading or threaded screw/s received in threaded openings 147 defined in lid 155, Velcro or magnetic fastener, etc.) or alternatively a quick-connect device (e.g., such as plastic or other type snap-in connectors, clamp mechanism, etc.) in an aligned position with a corresponding lid opening 163. An optional O-ring insulator 141 (e.g., rubber or foam) may be positioned as shown between each supply outlet 177 and underside surface of a given lid 155 to provide a solid seal and to help prevent vibration and noise. Once supplemental cooling system 180 is so assembled, it is configured to receive a notebook/laptop computer 100 having air inlet/s 161 that correspond to the location/s of the lid opening/s 163 in the given lid 155 as shown. This advantageously allows a user, or other entity such as factory assembler, to configure and/or reconfigure a given supplemental cooling system 180 to operably cool multiple different size/s and/or configuration/s of portable information handling system. In one exemplary embodiment, a supplemental cooling system 180 may be manufactured and shipped or otherwise provided to an end user with multiple differently configured lids 155 which each provides one or more unique supplemental cooling air supply outlet position/s 177 that are configured to align with respective air inlet positions of a different type and/or size of portable information handing system 100.

Although two different cooling positions (and corresponding lids 155*a* and 155*b*) are illustrated, it will be understood that cooling air supply conduits 197 of this embodiment are adjustable to fit infinite different locations and configurations of lid openings 163 that themselves correspond to different air inlet locations of respective different portable information handling systems. Thus, in one embodiment, it is possible that a user may choose a given lid 155 to fit a corresponding portable information handling system (e.g., such as a given size and/or configuration of notebook or laptop computer) from more than two different available lids 155 that have different respective lid opening configurations that are designed to fit different air inlet openings of different portable information handling systems. This advantageously allows a given single cooling system configuration to be used to effectively cool multiple different types of information handling system configurations, and to allow a given single supplemental cooling system 180 to be reconfigured with different lids as needed to operably fit different configurations of portable information handling systems. Moreover, it will be understood that a supplemental cooling system 180 may be provided with as few as one repositionable cooling air supply conduit 197 and corresponding attached cooling air supply outlet 177, or more than two repositionable cooling air supply conduits 197 and corresponding attached cooling air supply outlets 177. Further, it is possible in another embodiment that a supplemental cooling system 180 may be provided with multiple supplemental cooling air supply sources 133 that are each attached to provide supplemental cooling air to at least one repositionable cooling air supply conduit 197 and corresponding attached cooling air supply outlet 177 that is separate and different from a repositionable cooling air supply conduit 197 and corresponding cooling air supply outlet 177 that is attached to receive supplemental cooling air from a different one of the multiple supplemental cooling air supply sources 133.

Figure 3:
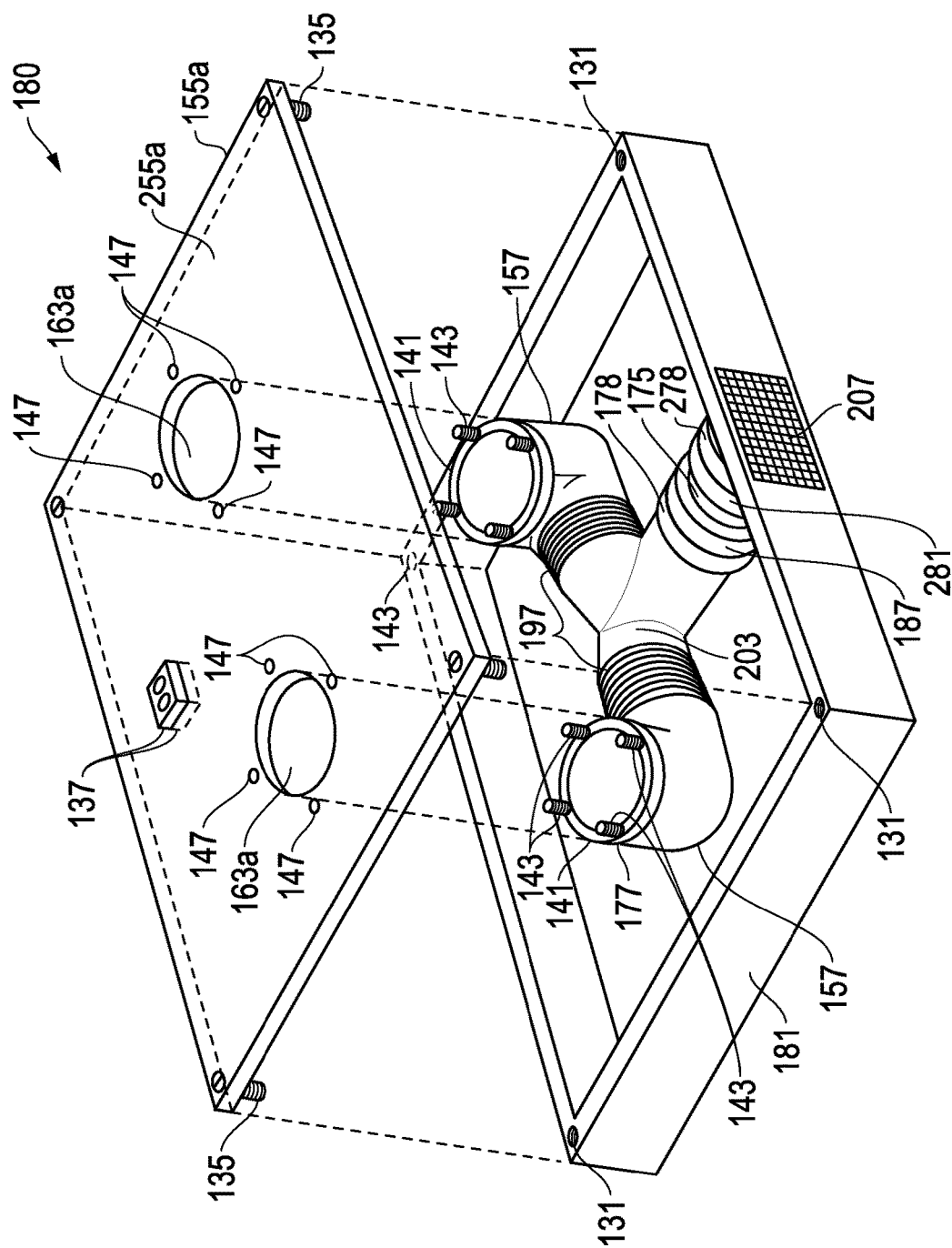
FIG. 3 illustrates a rear exploded perspective view of a supplemental cooling system according to one exemplary embodiment of the disclosed systems and methods.
Figure 4:
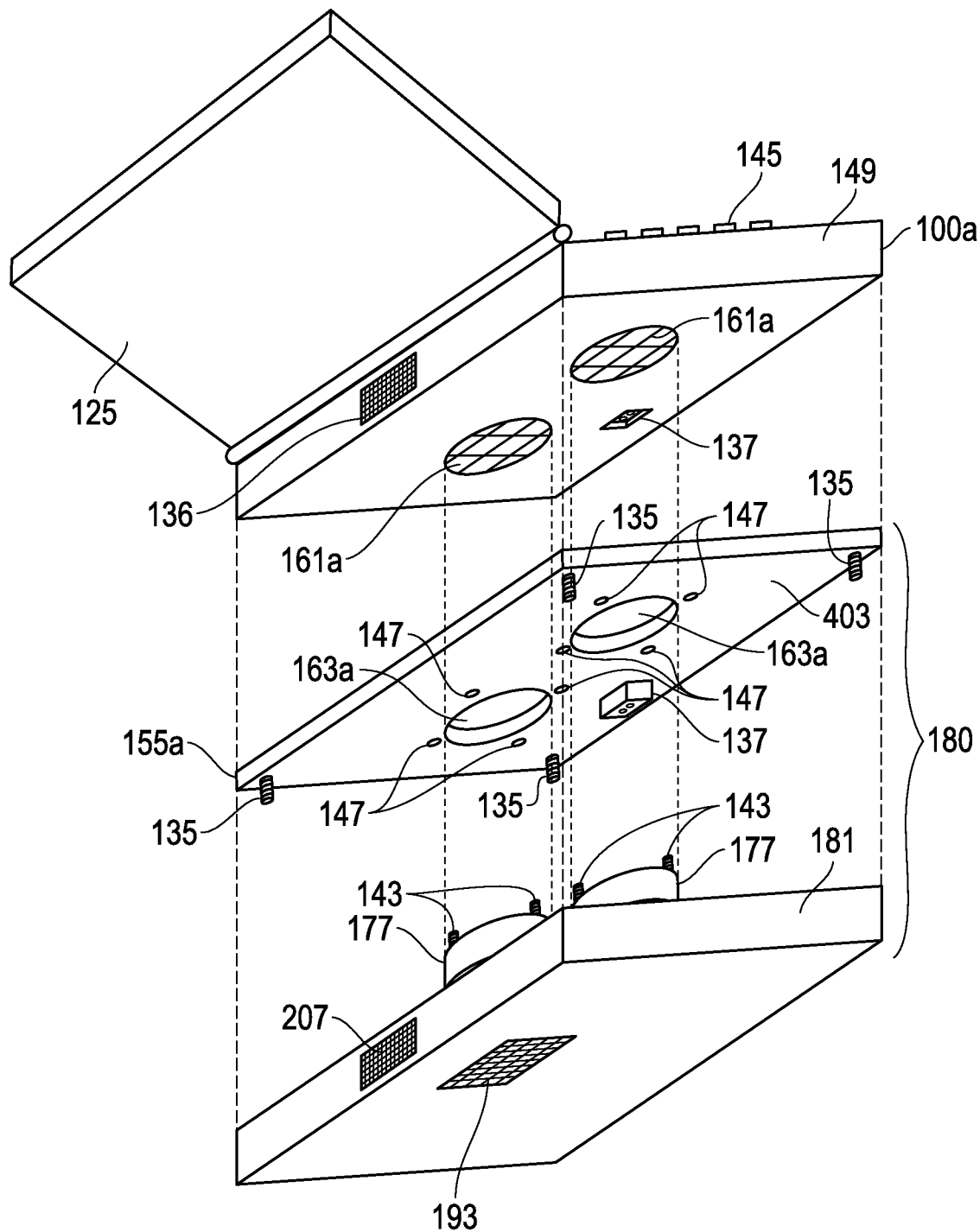
FIG. 4 illustrates a rear exploded perspective view of a supplemental cooling system and portable information handling system configured in operable relationship according to one exemplary embodiment of the disclosed systems and methods.

FIGS. 3 and 4 illustrate overhead and underneath exploded rear perspective views of supplemental cooling system 180 and lid 155a configured for assembly together, in this case using threaded fasteners 135 extending through lid 155a and received in complementary threaded fastener holes 131 of cooling system chassis 181. Also shown are threaded fasteners 143 configured to securely attach each cooling air supply outlet 177 to lid 155a in aligned sealed relationship with one of lid openings 163a. It will be understood that any other suitable type of fastener technology (e.g., Velcro or magnetic fasteners, snap clip fasteners, etc.) may be utilized to mechanically couple lid 155a to cooling system chassis 181.

It will be understood that movable cooling air supply outlets of the disclosed systems and methods may be implemented in any manner that is suitable for providing supplemental cooling air from a cooling system at multiple possible aligned positions corresponding to differently-located air inlet locations for different types, sizes and/or configurations of information handling systems, such as notebook computers and laptop computers. For example, FIG. 5 illustrates an alternative embodiment in which a single 90 degree or right angle wide angle funnel 503 (e.g., made of PVC or other suitable air conduit material) is configured to provide supplemental cooling air to air inlets of a portable information handing system from two side-by-side cooling air supply outlets 177 of a supplemental cooling system 180 (supplemental cooling system 180 and lid 155 not shown in FIG. 5). In the illustrated embodiment of FIG. 5, non-chilled supplemental air may be provided through a single flexible and repositionable cooling air supply conduit 197 from a supplemental cooling air supply source 133 that includes only a cooling fan 178.

Figure 6A:
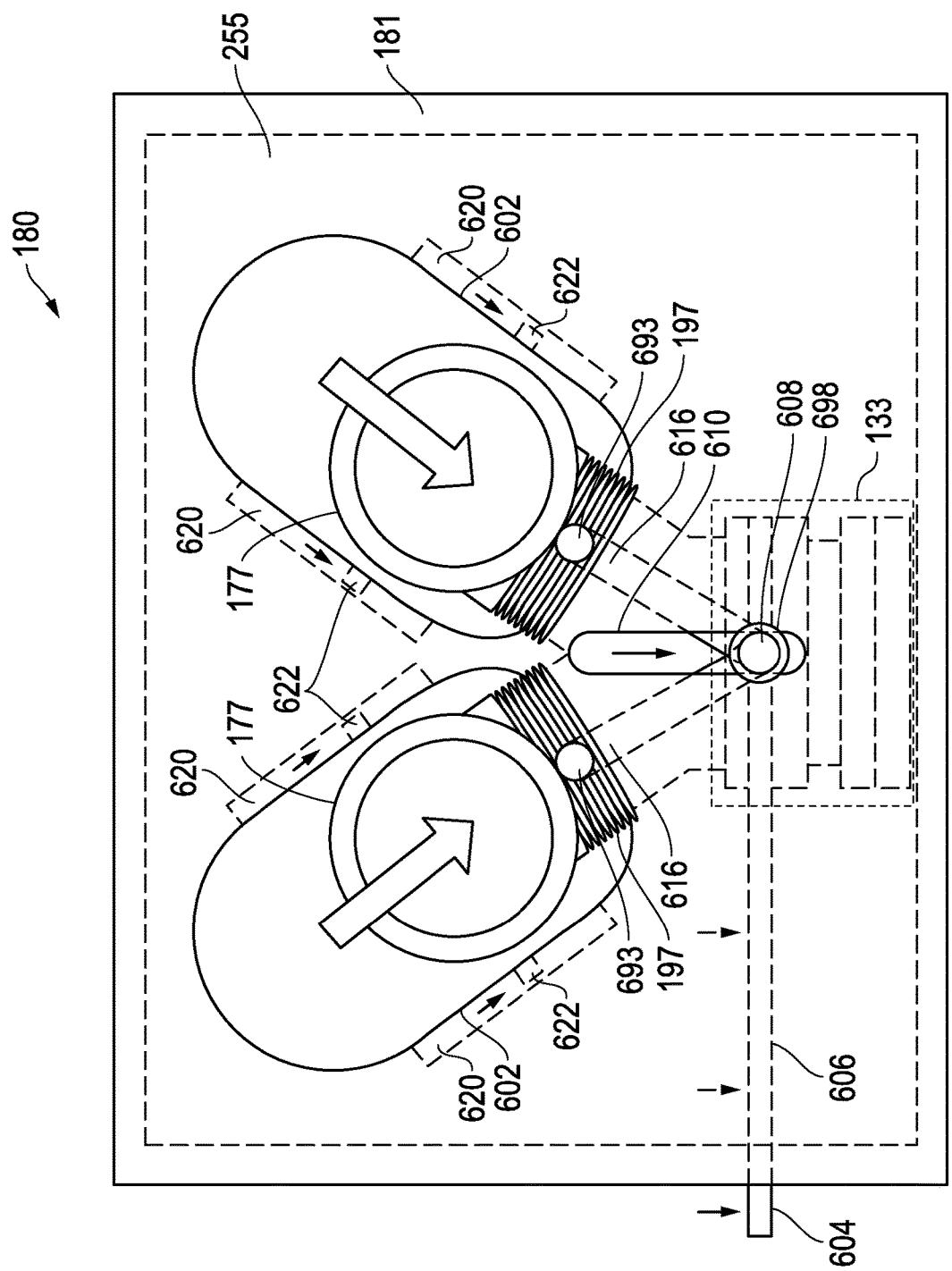
FIG. 6A illustrates an overhead view of a supplemental cooling system according to one exemplary embodiment of the disclosed systems and methods.
Figure 6B:
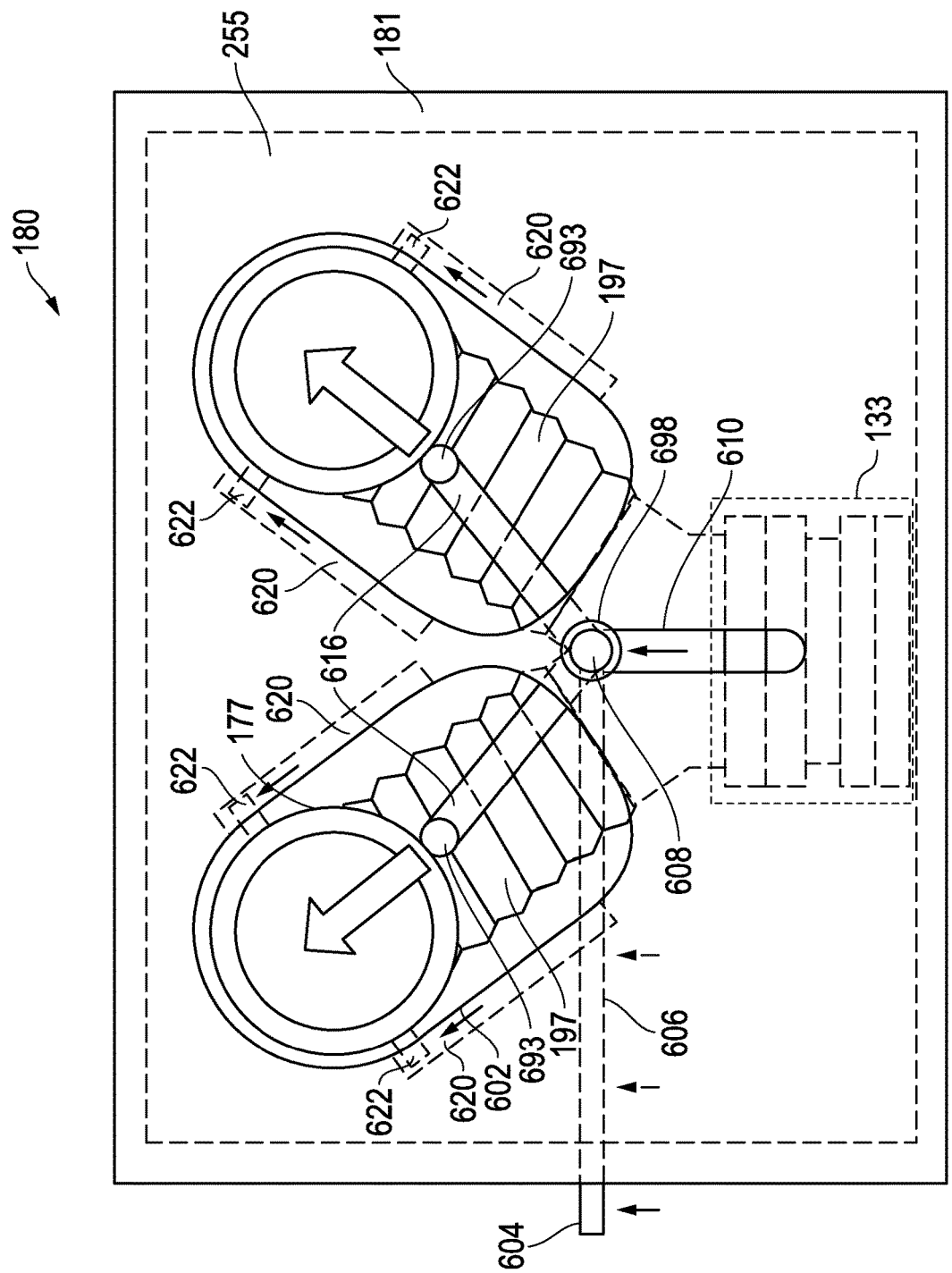
FIG. 6B illustrates an overhead view of a supplemental cooling system according to one exemplary embodiment of the disclosed systems and methods.

FIGS. 6A and 6B illustrate another exemplary embodiment of a supplemental cooling system 180 having an optional actuator in the form of a slidable mechanical lever 604 provided on one side of the cooling system chassis 181 to allow a user to adjust the physical position of cooling air supply outlets 177 between two pre-determined cooling air supply outlet positions (and optionally in any position therebetween) by sliding the lever 604 from the position shown in FIG. 6A to the position shown in FIG. 6B, and vice-versa. As shown in FIGS. 6A and 6B, a fixed cooling system lid 255 is provided in this exemplary embodiment with two larger angled elongated slots 602 through which respective movable cooling air supply outlets 177 extend so as to be slidably movable within slots 602 to be aligned with and to form a substantially air-tight seal with air inlets 161 of a mated portable information handling system, e.g., similar to the manner illustrated with respect to the embodiment of FIGS. 1A and 1B. However, in the embodiment of FIGS. 6A and 6B, each of cooling air supply outlets 177 are slidably supported by tabs 622 which are coupled to each side of the cooling aperture structure periphery and that are each slidably received in a corresponding lid groove 620 defined within the lid 155 adjacent and continuous to each side of each slot 602 as shown in dashed outline. As shown, each of movable cooling air supply outlets 177 are coupled to a respective flexible and repositionable cooling air supply conduit 197 (e.g., via a right angle elbow conduit fitting 157) that are configured to operate in a manner similar to that described in relation to FIGS. 1A-1B and 2A-2B.

As further shown in FIGS. 6A and 6B, a sliding pivot pin 608 is slidably received and held in place within narrower elongated slot 610 (e.g., by overlapping peripheral bushings or washers 698). Sliding pivot pin 608 is in turn coupled to slidable mechanical lever 604 by main connecting rod 606 such that the act of moving pivot pin 604 up and down causes main connecting rod 606 to move sliding pivot pin 608 in corresponding up and down fashion within slot 610 as shown. Sliding pivot pin 608 is in turn coupled to each cooling air supply outlet 177 by an angled connecting rod 616 via an output aperture pivot pin 693 as shown, such that up and down movement of sliding pivot pin 608 is translated by each angled connecting rod 616 to corresponding angular motion of each respective cooling air supply outlet 177 within its respective larger elongated slot. In this way, a user may move lever 604 to cause repositioning of movable cooling air supply outlet/s 177 to align with different locations of air inlets 161 corresponding to different types and/or sizes of portable information handling systems 100, e.g., without removing lid 255 from cooling system chassis 181. For example, lever 604 may be moved to its lower position shown in FIG. 1A to align cooling air supply outlets 177 with air inlets 161a of a 13 inch notebook computer such as the computer 100a illustrated in FIG. 6A, and lever 604 may be moved to its upper position shown in FIG. 6B to align cooling air supply outlets 177 with air inlets 161b of a 17 inch notebook computer 100b such as the computer 100b illustrated in FIG. 1B.

It will be understood that the particular mechanical actuator configuration of FIGS. 6A-6B is exemplary only, and that any other suitable mechanical and/or electrically assisted actuator system may be alternatively implemented to move one or more cooling air supply outlets 177 so that they align with air inlets 161 of a given type and/or size of portable information handling system 100. For example, a rack and pinion drive system may be provided having the rack portion coupled to (or integral with) sliding pivot pin 608, and having a user-controllable electric motor coupled to turn the pinion to drive the rack portion and sliding pivot pin 608 back and forth in both directions (e.g., in a similar manner as shown in FIGS. 6A and 6B) so as to reposition movable cooling air supply outlets 177 as desired.

Figure 6C:
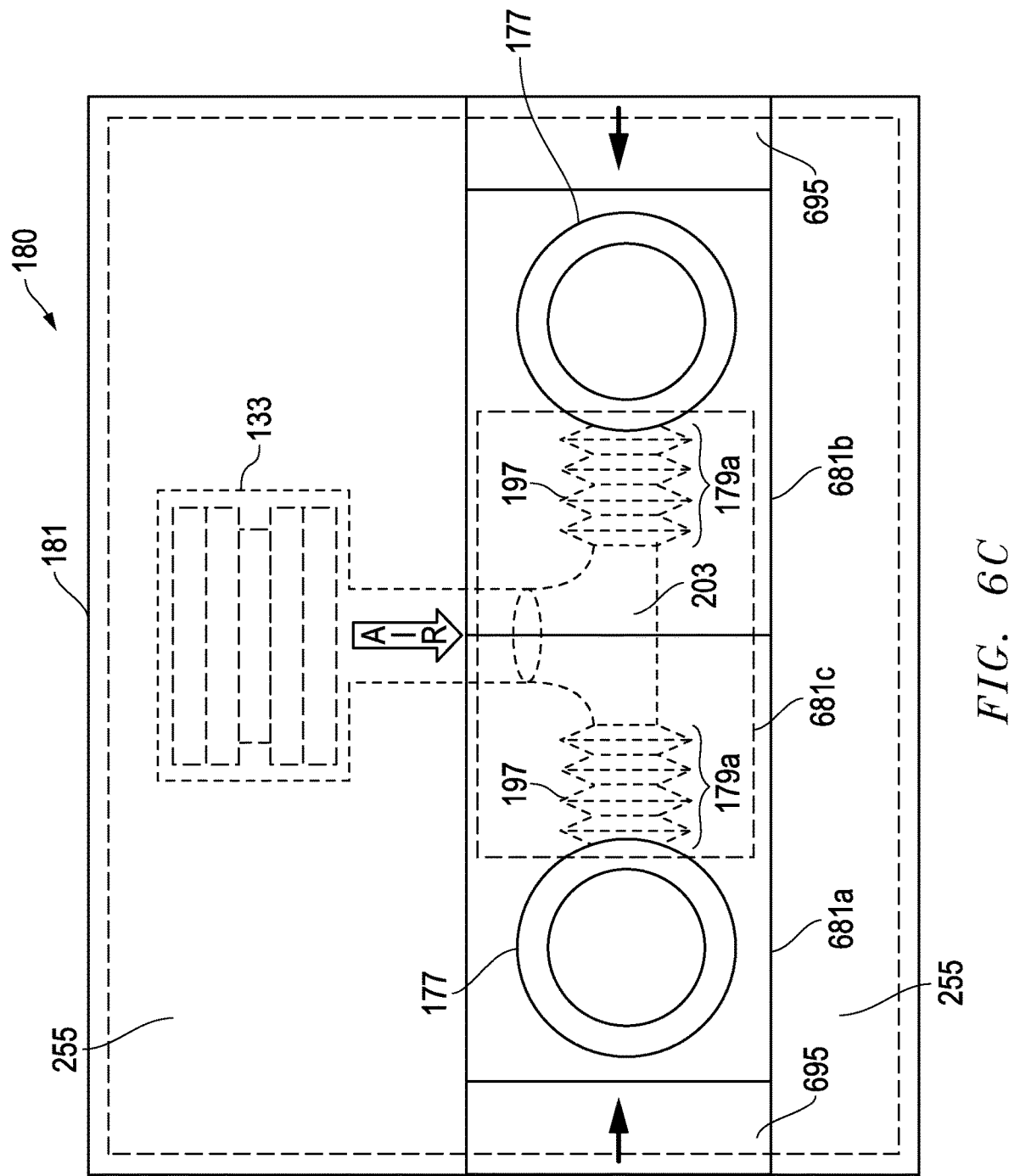
FIG. 6C illustrates an overhead view of a supplemental cooling system according to one exemplary embodiment of the disclosed systems and methods.
Figure 6D:
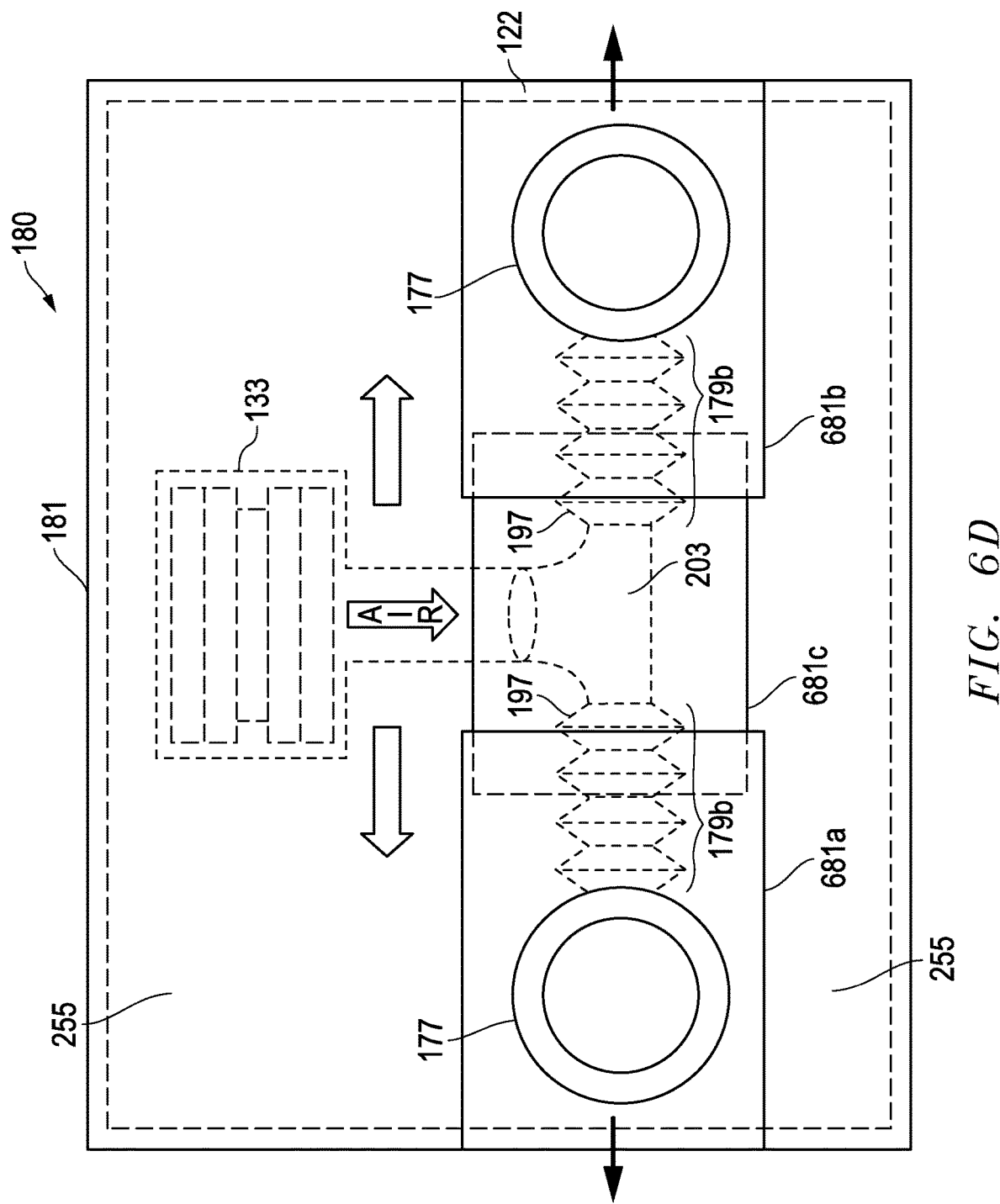
FIG. 6D illustrates an overhead view of a supplemental cooling system according to one exemplary embodiment of the disclosed systems and methods.

FIGS. 6C and 6D illustrate overhead views of another exemplary embodiment of a supplemental cooling system 180 that is configured with a two-piece cooling system chassis having recessed cooling system chassis components 681a and 681b that are slidably received around a recessed cooling system chassis component center section 681c all of which are disposed within chassis 181 and at or beneath the level of the chassis lid 255 so as to be movable inward and outward within complementary dimensioned recesses 695 relative to the cooling system chassis center section 681c. In this embodiment, one of moveable cooling air supply outlets 177 is fixedly attached to cooling system chassis component 681a and one of moveable cooling air supply outlets 177 is fixedly attached to cooling system chassis component 681b as shown. Thus, the inward and outward movement of cooling system chassis components 681a and 681b within complementary dimensioned recesses 695 relative to the cooling system chassis center section 681c causes repositioning of attached movable cooling air supply outlets 177 to align with different locations of air inlets 161 corresponding to different types and/or sizes of portable information handling systems 100, e.g., without removing lid 255 from cooling system chassis 181.

As shown, in FIG. 6D, a user may pull both chassis components 681*a* and 681*b* outward and away from each other to accommodate a relatively larger distance between two portable information handling system air inlet locations 161, and may push both chassis sides 681*a* and 681*b* inward to accommodate relatively smaller distance between two portable information handling system air inlet locations 161 as shown in FIG. 6C. For example, chassis components 681*a* and 681*b* may be positioned inward as shown in FIG. 6C to align cooling air supply outlets 177 with air inlets 161*a* of a 13 inch notebook computer such as the computer 100*a* illustrated in FIG. 1A, and chassis components 681*a* and 681*b* may be positioned outward as shown in FIG. 6D to align cooling air supply outlets 177 with air inlets 161*b* of a 17 inch notebook computer 100*b* such as the computer 100*b* illustrated in FIG. 1B.

Figure 7A:
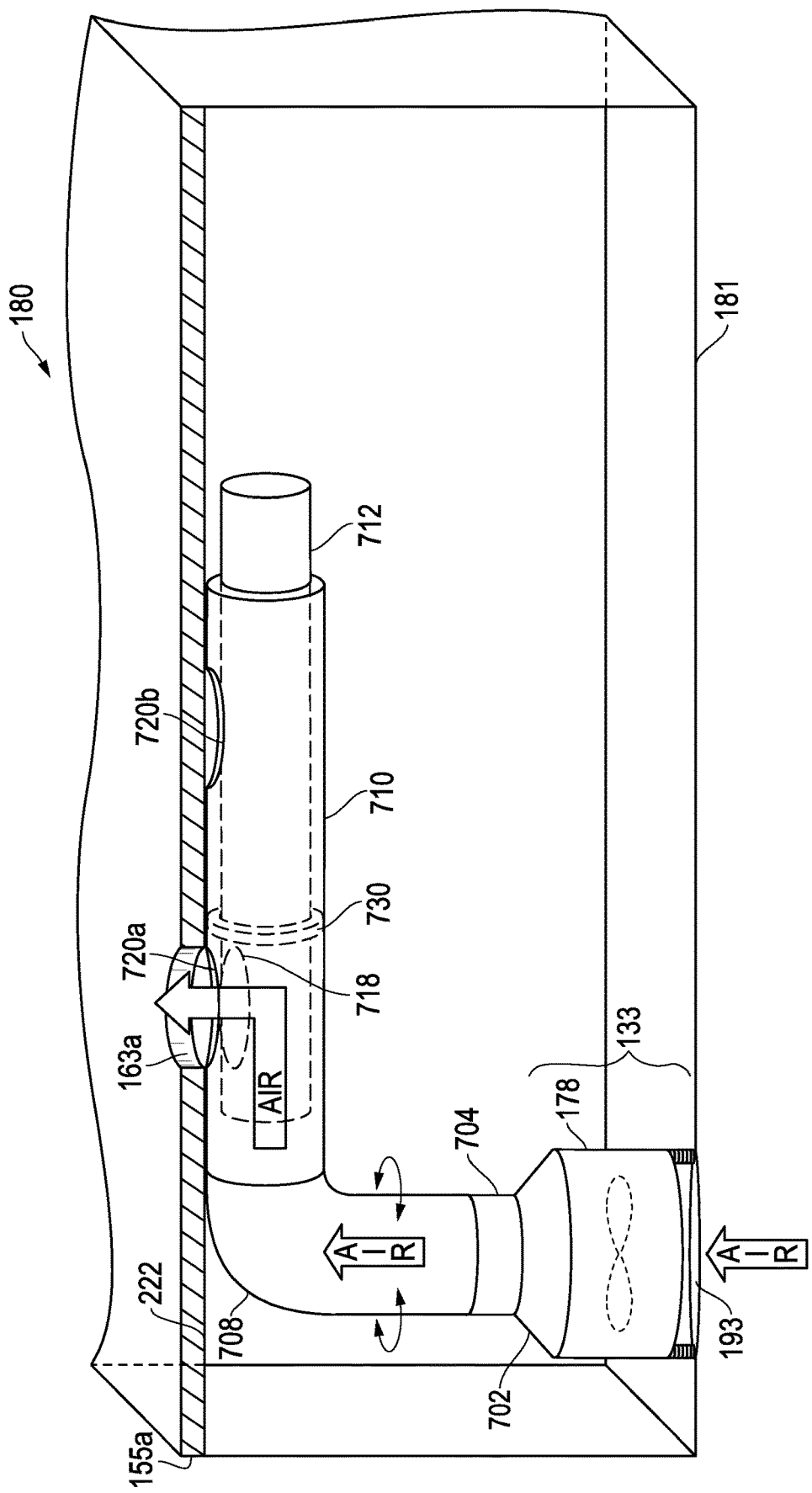
FIG. 7A illustrates a side partial cross-sectional view of a supplemental cooling system according to one exemplary embodiment of the disclosed systems and methods.
Figure 7B:
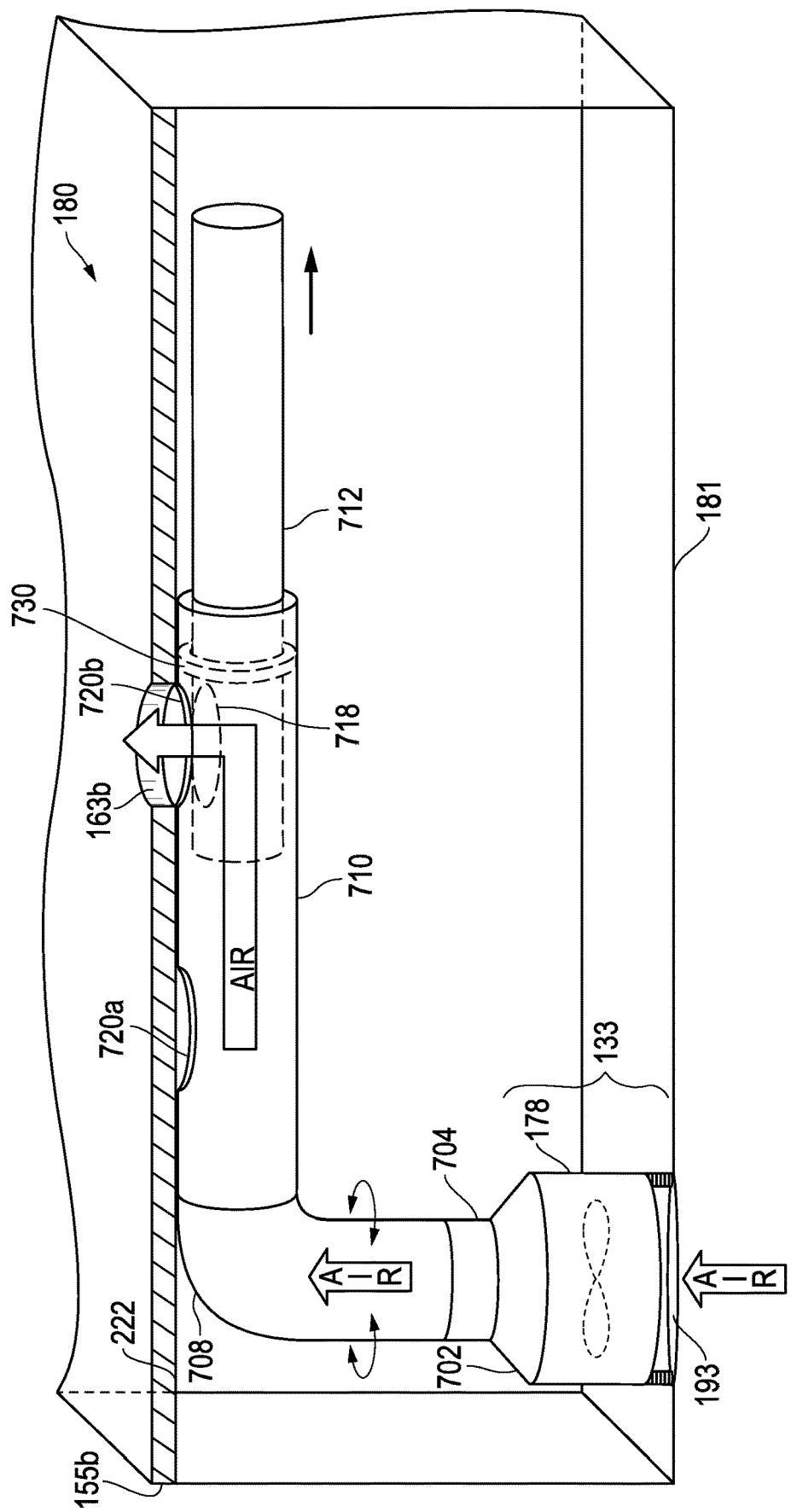
FIG. 7B illustrates a side partial cross-sectional view of a supplemental cooling system according to one exemplary embodiment of the disclosed systems and methods.

FIGS. 7A and 7B illustrate an another exemplary embodiment of a supplemental cooling system 180 having a mechanically-adjustable cooling air supply conduit provided in the form of a rigid telescoping inner conduit 712 (e.g., PVC or other suitable conduit material) that is slidably received and positioned within a rigid outer support conduit 710 (e.g., PVC or other suitable conduit material). As shown, a peripheral air-tight seal may be provided between the inner and outer conduits 712 and 710 by an annular sliding sealing member 730 (e.g., such as Teflon or felt annular member) that allows inner conduit 712 to be slid (e.g., by a user) between positions shown in FIGS. 7A and 7B while maintaining an air seal between conduits 712 and 710. As further shown, outer conduit 710 is coupled via right-angled conduit member 708 (e.g., PVC or other suitable conduit material) between an upward facing cooling fan 178 and optional air velocity intensifier/increaser 702 of a supplemental cooling air supply source 133 such that supplemental cooling air is directed upward and then re-directed horizontally to be output via movable inner conduit cooling supply outlet 718 and one of two aligned alternative outer conduit cooling supply outlets 720*a* or 720*b* as shown in respective FIGS. 7A and 7B. In one embodiment, cooling supply outlets 720*a* or 720*b* may form an air tight seal to underside of lid 155*a* or 155*b* by a sealing member such as optional rubber or foam grommet or gasket (not shown) positioned between outer conduit 710 and underside of a lid 155 around the periphery of the cooling supply outlets 720*a* and 720*b* and corresponding lid openings 163*a* or 163*b*. In this particular embodiment, a user may interchange lids 155*a* and 155*b* and reposition inner conduit 712 so as to selectably provide supplemental cooling air to different air inlet locations 161*a* and 161*b* (see FIGS. 1A and 1B) of different geometry and/or different size information handling systems 100*a* and 100*b* in a similar manner as shown and described in relation to FIGS. 1A-1B.

In the exemplary embodiment of FIGS. 7A and 7B, conduits 712 and 710 may be optionally rotatable (e.g., via rotating interface created between lower end of right-angled conduit member 708 and outer conduit sleeve 704) relative to fixed supplemental cooling air supply source 133 as shown, e.g., to provide additional movement direction and range for different supplement cooling air outlet positions. As further shown in the embodiment of FIGS. 7A-7B, supplemental cooling air supply source 133 is vertically oriented and draws in air from a cooling system air inlet 193 positioned in the base of the cooling system chassis 181 as shown. It will be understood that this or any other suitable alternative orientation of supplemental cooling air supply source 133 may be employed (e.g., together with appropriate geometry of one or more air conduits) with other embodiments of the disclosed systems and methods, e.g., such as the embodiments of FIGS. 1-6. It will also be understood that it is possible in some embodiments that a mechanically-adjustable cooling air supply conduit may be provided with flexible (rather than rigid) telescoping outer and/or inner conduits.

Figure 8A:
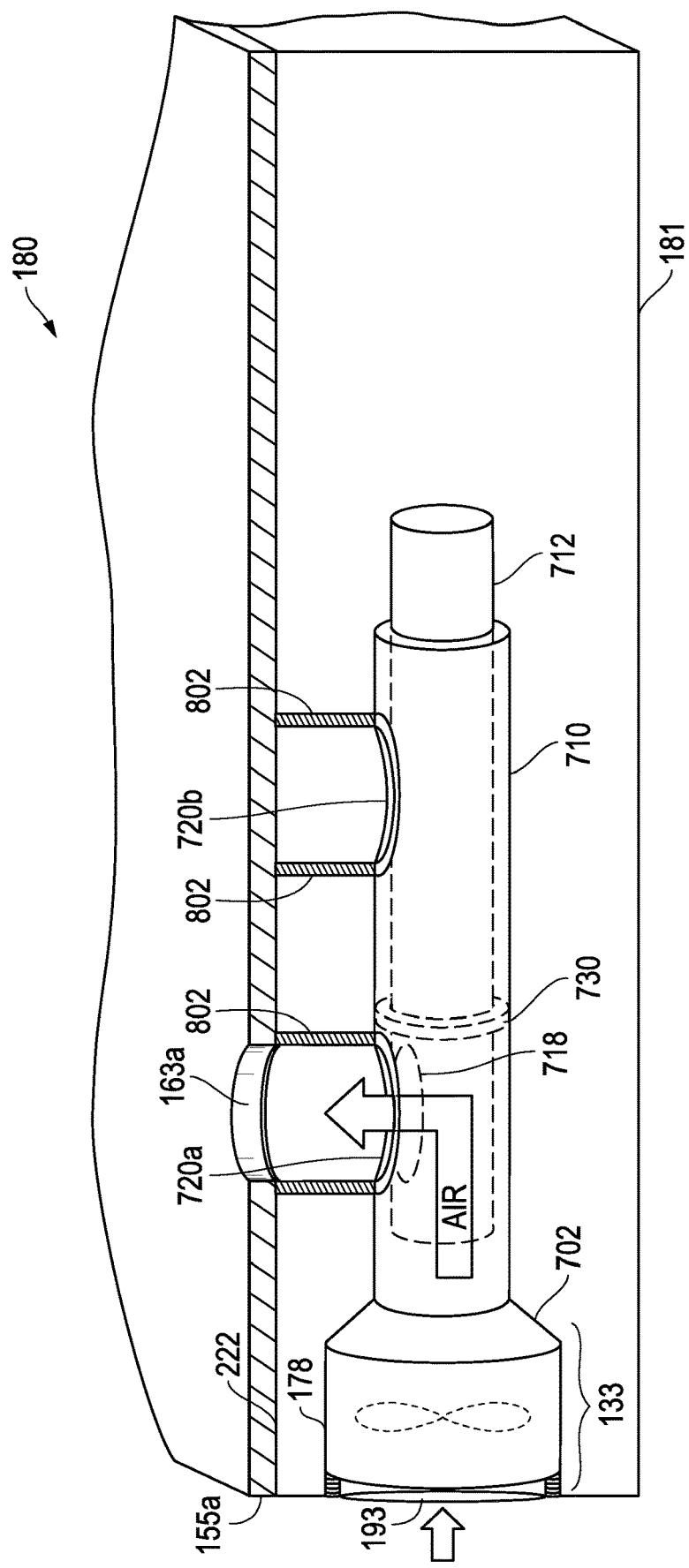
FIG. 8A illustrates a side partial cross-sectional view of a supplemental cooling system according to one exemplary embodiment of the disclosed systems and methods.
Figure 8B:
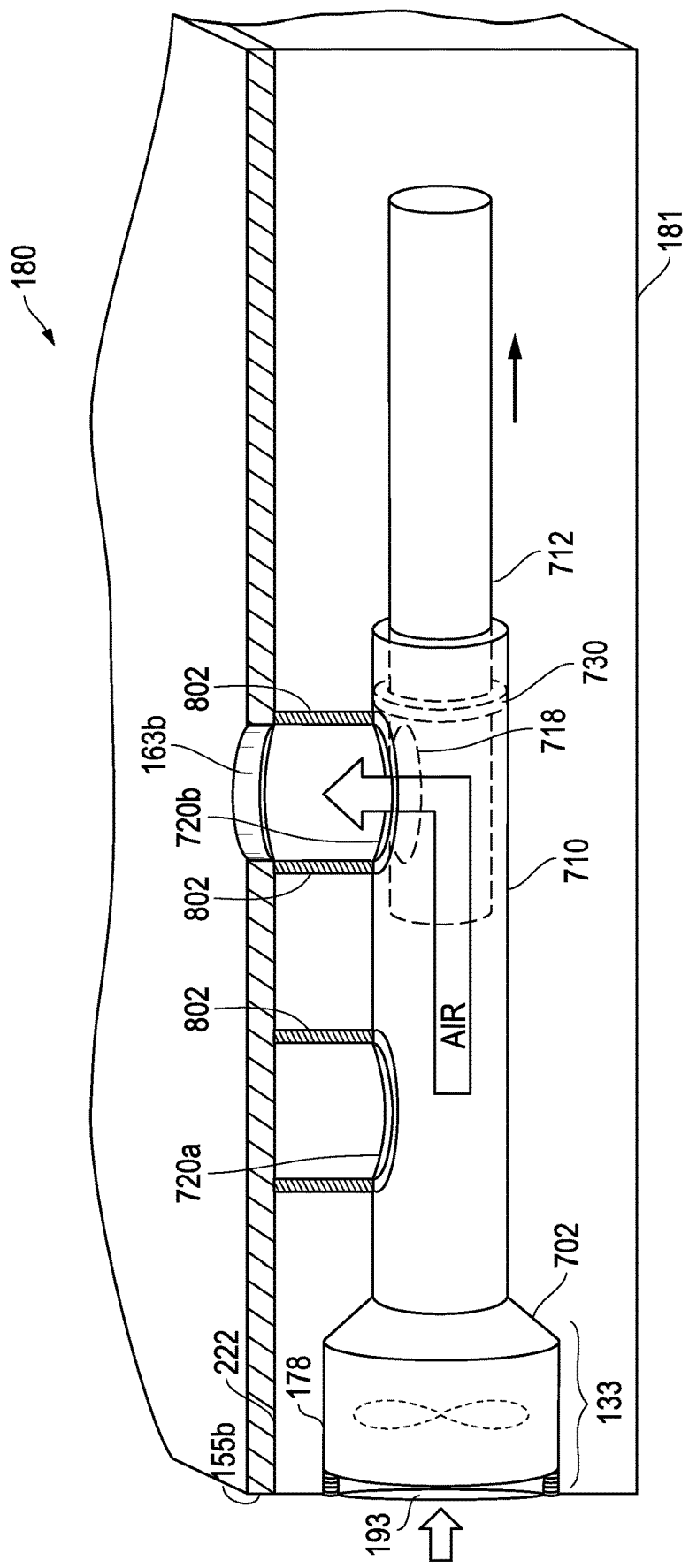
FIG. 8B illustrates a side partial cross-sectional view of a supplemental cooling system according to one exemplary embodiment of the disclosed systems and methods.

FIGS. 8A and 8B illustrate another exemplary embodiment of a supplemental cooling system 180 having a repositionable cooling air supply conduit provided in the form of a telescoping inner conduit 712 positioned within an outer support conduit 710 similar to the embodiment of FIGS. 6A and 6B, except that supplemental cooling air supply source 133 of FIGS. 8A and 8B is horizontally-oriented and air conduits conduits 712 and 710 do not rotate in the manner described and illustrated with respect to the embodiment of FIGS. 7A and 7B. Such an embodiment may be implemented, for example, to achieve a lower profile installation having a thinner cooling system chassis 181. As further shown in FIGS. 8A and 8B, riser conduit sections 802 (e.g., PVC conduit) are provided to extend upward from each of the outer outer conduit cooling supply outlets 720*a* and 720*b* to sealingly conduct the supplemental cooling air from a selected one of the outer conduit cooling supply outlets 720*a* and 720*b* to a corresponding lid opening 163*a* or 163*b* that is selected to provide supplemental cooling air to one of different air inlet locations 161*a* and 161*b* (see FIGS. 1A and 1B) of different geometry and/or different size information handling systems 100*a* and 100*b* in a similar manner as shown and described in relation to FIGS. 1A-1B.

It will be understood that one or more of the tasks, functions, or methodologies described herein (e.g., including those described herein for components 173, 191, etc.) may be implemented by circuitry and/or by a computer program of instructions (e.g., computer readable code such as firmware code or software code) embodied in a non-transitory tangible computer readable medium (e.g., optical disk, magnetic disk, non-volatile memory device, etc.), in which the computer program comprising instructions are configured when executed (e.g., executed on a processing device of an information handling system such as CPU, controller, microcontroller, processor, microprocessor, FPGA, ASIC, or other suitable processing device) to perform one or more steps of the methodologies disclosed herein. In one embodiment, such processing devices may be selected from the group consisting of CPU, controller, microcontroller, processor, microprocessor, FPGA, and ASIC. A computer program of instructions may be stored in or on the non-transitory computer-readable medium accessible by an information handling system for instructing the information handling system to execute the computer program of instructions. The computer program of instructions may include an ordered listing of executable instructions for implementing logical functions in the information handling system. The executable instructions may comprise a plurality of code segments operable to instruct the information handling system to perform the methodology disclosed herein. It will also be understood that one or more steps of the present methodologies may be employed in one or more code segments of the computer program. For example, a code segment executed by the information handling system may include one or more steps of the disclosed methodologies.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touch screen and/or a video display. The information handling system may also include one or more buses operable to transmit communications between the various hardware components.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems and methods may be utilized in various combinations and/or independently. Thus the invention is not limited to only those combinations shown herein, but rather may include other combinations.

What is claimed is:

1. A supplemental cooling system, comprising:
   multiple different removable and interchangeable planar lids, at least a first one of the multiple different removable and interchangeable planar lids having at least one first lid opening defined within the first removable and interchangeable lid in a position relative to the outer boundaries of the first removable and interchangeable lid that is different from a position of at least one second lid opening defined within at least a second one of the multiple removable and interchangeable lids relative to the outer boundaries of the second one of the removable and interchangeable lids;
   a chassis receiving each of the first and second removable and interchangeable planar lids alone and one at a time to selectively mate one at a time with a different respective one of a plurality of different types and/or sizes of mated notebook computers or laptop computers that each have at least one cooling air inlet located in a different location relative to the chassis than a location of the at least one cooling air inlet of the other mated notebook computers or laptop computers; and
   at least one movable cooling air supply outlet coupled to provide supplemental cooling air;
   wherein the movable cooling air supply outlet is adjustable between multiple different positions relative to the chassis so as to align the movable cooling air supply outlet to provide the supplemental cooling air to the position of the first lid opening defined within the first removable and interchangeable lid received alone by the chassis and so as to align the movable cooling air supply outlet to provide the supplemental cooling air to the different position of the second lid opening defined within the second removable and interchangeable lid received alone by the chassis, the first lid opening defined within the received first removable and interchangeable lid and the second lid opening defined within the received second removable and interchangeable lid providing the supplemental cooling air to the different cooling air inlet locations, respectively, of the different sizes and/or types of mated notebook computers or laptop computers.

2. The system of claim 1, further comprising:
   at least one cooling fan coupled to the chassis; and
   wherein the at least one movable cooling air supply outlet is coupled by a mechanically-adjustable cooling air supply conduit to receive the supplemental cooling air from the cooling fan.

3. The system of claim 2, further comprising at least one of a thermoelectric cooler, vapor compression refrigeration device, absorption refrigeration device, liquid/gas refrigeration system, or evaporative cooling that is configured to cool the supplemental cooling air to a temperature that is less than the available external ambient temperature air that surrounds the supplemental cooling system.

4. The system of claim 1, further comprising at least one cooling fan; and wherein the movable cooling air supply outlet is coupled to the cooling fan by a flexible and repositionable cooling air supply conduit.

5. The system of claim 1, further comprising at least one cooling fan; and wherein the movable cooling air supply outlet is coupled to the cooling fan by at least one rigid telescoping inner conduit that is slidably received and positioned within a rigid outer support conduit.

6. The system of claim 1, further comprising at least one cooling fan and where each of the first and second removable and interchangeable lids is coupled alone to the chassis between the cooling fan and a different first or second mated notebook computer or laptop computer, respectively, the first lid opening of the received first removable and interchangeable lid receiving the movable cooling air supply outlet therein to align the movable cooling air supply outlet with the at least one cooling air inlet location of the first mated notebook computer or laptop computer, and the second lid opening of the received second removable and interchangeable lid receiving the movable cooling air supply outlet therein to align the movable cooling air supply outlet with the at least one cooling air inlet location of the second mated notebook computer or laptop computer.

7. The system of claim 1, further comprising:
   at least one cooling fan;
   wherein the chassis is coupled to each given one of the multiple different removable and interchangeable lids one at a time such that each given lid is coupled to the chassis between the cooling fan and a different given mated notebook computer or laptop computer; and
   wherein the at least one first lid opening of the received first removable and interchangeable lid is positioned in a different location relative to the chassis than the at least one second lid opening of the received second removable and interchangeable lid;
   wherein the first lid opening of the received first removable and interchangeable lid is receiving the movable cooling air supply outlet therein to align the movable cooling air supply outlet with at least one first cooling air inlet location of a mated first given notebook computer or laptop computer;

wherein the second lid opening of the received second and different removable and interchangeable lid is receiving the movable cooling air supply outlet therein to align the movable cooling air supply outlet with at least one second cooling air inlet location of a second and different given notebook computer or laptop computer; and wherein the at least one first cooling air inlet location of the mated first given notebook computer or laptop computer is positioned at a different location relative to the chassis than is the at least one second cooling air inlet location of the mated second and different given notebook computer or laptop computer.

8. The system of claim 1, further comprising an actuator mechanically coupled to move the movable cooling air supply outlet between the multiple different positions relative to the chassis so as to align the movable cooling air supply outlet to provide supplemental cooling air to the different cooling air inlet locations of the different sizes and/or types of mated notebook computers or laptop computers.

9. The system of claim 1, wherein the movable cooling air supply outlet is configured to be continuously adjustable throughout a range of distance between multiple different positions relative to the chassis.

10. A method of cooling an notebook computer or laptop computer, comprising:

providing multiple different removable and interchangeable planar lids, at least a first one of the multiple different removable and interchangeable planar lids having at least one first lid opening defined within the first removable and interchangeable lid in a position relative to the outer boundaries of the first removable and interchangeable lid that is different from a position of at least one second lid opening defined within at least a second and different one of the multiple removable and interchangeable lids relative to the outer boundaries of the second one of the removable and interchangeable lids;

mating a first chassis enclosure of only a first notebook computer or laptop computer having at least one first cooling air inlet defined therein with a supplemental cooling system having at least one movable cooling air supply outlet coupled to a chassis of the supplemental cooling system;

selecting and using the first removable and interchangeable planar lid to adjust a position of the movable cooling air supply outlet of the supplemental cooling system relative to the chassis of the supplemental cooling system so that the movable cooling air supply outlet is aligned with a location of the first cooling air inlet of the mated first notebook computer or laptop computer; and then providing supplemental cooling air from the cooling air supply outlet of the supplemental cooling system to the first cooling air inlet of the first notebook computer or laptop computer while operating an internal cooling fan of the first notebook computer or laptop computer to draw in the supplemental cooling air.

11. The method of claim 10, wherein the supplemental cooling system further comprises at least one cooling fan coupled to the chassis of the supplemental cooling system; and wherein the at least one movable cooling air supply outlet is coupled by a mechanically-adjustable cooling air supply conduit to receive the supplemental cooling air from the cooling fan.

12. The method of claim 11, where the supplemental cooling system further comprises at least one of a thermoelectric cooler, vapor compression refrigeration device, absorption refrigeration device, liquid/gas refrigeration system, or evaporative cooling; and wherein the method further comprises using the at least one of a thermoelectric cooler, vapor compression refrigeration device, absorption refrigeration device, liquid/gas refrigeration system, or evaporative cooling to cool the supplemental cooling air to a temperature that is less than the available external ambient temperature air that surrounds the supplemental cooling system prior to providing the supplemental cooling air from the cooling air supply outlet of the supplemental cooling system to the first cooling air inlet of first notebook computer or laptop computer.

13. The method of claim 10, wherein the first notebook computer or laptop computer is one of a plurality of different types and/or sizes of notebook computers or laptop computers; and wherein the method further comprises:

then mating the chassis of the supplemental cooling system with only a second one of the plurality of different types and/or sizes of notebook computers or laptop computers, the mated second notebook computer or laptop computer having at least one second cooling air inlet positioned in a different location relative to the chassis of the supplemental cooling system than a location of the at least one first cooling air inlet of the mated first notebook computer or laptop computer;

selecting and using the second and different removable and interchangeable planar lid to adjust a position of the movable cooling air supply outlet of the supplemental cooling system relative to the chassis of the supplemental cooling system so that the movable cooling air supply outlet is aligned with a location of the second cooling air inlet of the mated second notebook computer or laptop computer; and adjusting the movable cooling air supply outlet from:
a first position relative to the chassis of the supplemental cooling system that aligns the movable cooling air supply outlet to provide the supplemental cooling air through the first lid opening of the first removable and interchangeable planar lid to the first cooling air inlet location of the mated first notebook computer or laptop computer,
to:
a second position relative to the chassis of the supplemental cooling system that aligns the movable cooling air supply outlet to provide the supplemental cooling air through the second lid opening of the second removable and interchangeable planar lid to the second cooling air inlet location of the mated second notebook computer or laptop computer.

14. The method of claim 13, further comprising an actuator mechanically coupled to move the movable cooling air supply outlet between the first and second positions relative to the chassis of the supplemental cooling system; and wherein the method further comprises using the actuator to move the movable cooling air supply outlet between the first and second positions relative to the chassis of the supplemental cooling system so as to align the movable cooling air supply outlet to provide supplemental cooling air to the different first and second cooling air inlet locations, respectively, of the different mated first and second notebook computers or laptop computers.

15. The method of claim 13, further comprising adjusting the movable cooling air supply outlet throughout a continuous range of distance between multiple different positions relative to the chassis that include the first and second positions relative the chassis of the supplemental cooling system.

16. The method of claim 10, where the supplemental cooling system further comprises at least one cooling fan; wherein the movable cooling air supply outlet is coupled to the cooling fan by a flexible and repositionable cooling air supply conduit; and wherein the method further comprises:
adjusting the position of the movable cooling air supply outlet of the supplemental cooling system relative to the chassis of the supplemental cooling system by moving the movable cooling air supply outlet together with the coupled flexible and repositionable cooling air supply conduit; and
then using the cooling fan to provide the supplemental cooling air from the cooling air supply outlet of the supplemental cooling system to the first cooling air inlet of the first notebook computer or laptop computer.

17. The method of claim 10, where the supplemental cooling system further comprises at least one cooling fan; wherein the movable cooling air supply outlet is coupled to the cooling fan by at least one rigid telescoping inner conduit that is slidably received and positioned within a rigid outer support conduit; and wherein the method further comprises: adjusting the position of the movable cooling air supply outlet of the supplemental cooling system relative to the chassis of the supplemental cooling system by sliding the inner conduit relative to the outer support conduit to move the movable cooling air supply outlet; and then using the cooling fan to provide the supplemental cooling air from the cooling air supply outlet of the supplemental cooling system to the first cooling air inlet of the first notebook computer or laptop computer.

18. The method of claim 10, where the supplemental cooling system further comprises at least one cooling fan and where the method further comprises:
coupling the first removable and interchangeable lid to the chassis of the supplemental cooling system in a position between the mated first notebook computer or laptop computer and the cooling fan with the at least one first lid opening receiving the movable cooling air supply outlet therein to align the movable cooling air supply outlet with the location of the at least one first cooling air inlet of the mated first notebook computer or laptop computer;
mechanically coupling the movable cooling air supply outlet to the first removable and interchangeable lid in alignment with the first lid opening;
then mechanically coupling the first removable and interchangeable lid to the chassis;
then positioning the chassis enclosure of the notebook computer or laptop computer on the first removable and interchangeable lid in mated relationship with the supplemental cooling system to align the movable cooling air supply outlet with the first cooling air inlet of the mated first notebook computer or laptop computer; and
then using the cooling fan to provide the supplemental cooling air from the cooling air supply outlet of the supplemental cooling system to the first cooling air inlet of the first notebook computer or laptop computer.

19. A method of cooling an notebook computer or laptop computer, comprising:
mating a chassis enclosure of a notebook computer or laptop computer having at least one cooling air inlet defined therein with a supplemental cooling system having at least one movable cooling air supply outlet coupled to a chassis of the supplemental cooling system;
providing and using a removable and interchangeable planar lid to adjust a position of the movable cooling air supply outlet of the supplemental cooling system relative to the chassis so that the movable cooling air supply outlet is aligned with a location of the cooling air inlet of the mated notebook computer or laptop computer; and
then providing supplemental cooling air from the cooling air supply outlet of the supplemental cooling system to the cooling air inlet of the notebook computer or laptop computer while operating an internal cooling fan of the notebook computer or laptop computer to draw in the supplemental cooling air;
where the supplemental cooling system further comprises at least one cooling fan; and
where the method further comprises:
mechanically coupling the cooling system chassis to multiple different removable and interchangeable lids and mechanically coupling the cooling fan with the lid opening of each given one of the multiple different lids in aligned relationship with the movable cooling air supply outlet,
mating each assembled lid and chassis with a different given notebook computer or laptop computer having a cooling air inlet location that is different relative to the chassis than each other of the different given notebook computers or laptop computers and such that each given lid is coupled to the chassis between a different given mated notebook computer or laptop computer and with the lid opening of each given lid being received in aligned relationship with the movable cooling air supply outlet, and
using the cooling fan to provide the supplemental cooling air from the cooling air supply outlet of the supplemental cooling system to the cooling air inlet of the each of the different mated notebook computers or laptop computers.

20. A supplemental cooling system, comprising:
a chassis configured to receive a removable and interchangeable planar lid to selectively mate with one of a plurality of different types and/or sizes of notebook computers or laptop computers that each have at least one cooling air inlet located in a different location relative to the chassis when mated with the chassis than the at least one cooling air inlet of the other notebook computers or laptop computers when mated with the chassis; and
at least one movable cooling air supply outlet coupled to provide supplemental cooling air;
wherein the movable cooling air supply outlet is configured to be adjustable between multiple different positions relative to the chassis so as to align the movable cooling air supply outlet to provide the supplemental cooling air to the different cooling air inlet locations of the different sizes and/or types of mated notebook computers or laptop computers;
wherein the system further comprises at least one cooling fan; wherein the chassis is configured to be coupled to any given one of multiple different removable and interchangeable lids such that each given lid is coupled to the chassis between a different given mated notebook computer or laptop computer and the cooling fan when the given lid is so coupled between the chassis and a corresponding different given mated notebook computer or laptop computer; and wherein each of the removable and interchangeable lids to which the chassis is configured to be coupled includes at least one lid opening defined therein in a different location relative to the chassis than the lid opening defined in each of the other removable and interchangeable lids such that the lid opening of a first given lid is configured to receive the movable cooling air supply outlet therein to align the movable cooling air supply outlet with at least one first cooling air inlet location of a first given notebook computer or laptop computer when it is mated with the first given notebook computer or laptop computer and such that the lid opening of a second given lid is configured to receive the movable cooling air supply outlet therein to align the movable cooling air supply outlet with at least one second cooling air inlet location of a second given notebook computer or laptop computer when it is mated with the second given notebook computer or laptop computer, the at least one first cooling air inlet location being positioned different relative to the chassis when mated with the first given notebook computer or laptop computer than the at least one second cooling air inlet location is positioned relative to the chassis when mated with the second given notebook computer or laptop computer; and wherein the system further comprises at least one of the multiple different removable and interchangeable lids, the at least one of the multiple different removable and interchangeable lids including at least one lid opening defined therein such that the lid opening is configured to receive the movable cooling air supply outlet therein to align the movable cooling air supply outlet with at least one cooling air inlet location of a given mated notebook computer or laptop computer.

21. A supplemental cooling system, comprising:

a chassis configured to receive a removable and interchangeable planar lid to selectively mate with one of a plurality of different types and/or sizes of notebook computers or laptop computers that each have at least one cooling air inlet located in a different location relative to the chassis when mated with the chassis than the at least one cooling air inlet of the other notebook computers or laptop computers when mated with the chassis; and at least one movable cooling air supply outlet coupled to provide supplemental cooling air;

wherein the movable cooling air supply outlet is configured to be adjustable between multiple different positions relative to the chassis so as to align the movable cooling air supply outlet to provide the supplemental cooling air to the different cooling air inlet locations of the different sizes and/or types of mated notebook computers or laptop computers;

wherein the system further comprises at least one cooling fan; wherein the chassis is configured to be coupled to any given one of multiple different removable and interchangeable lids such that each given lid is coupled to the chassis between a different given mated notebook computer or laptop computer and the cooling fan when the given lid is so coupled between the chassis and a corresponding different given mated notebook computer or laptop computer; and wherein each of the removable and interchangeable lids to which the chassis is configured to be coupled includes at least one lid opening defined therein in a different location relative to the chassis than the lid opening defined in each of the other removable and interchangeable lids such that the lid opening of a first given lid is configured to receive the movable cooling air supply outlet therein to align the movable cooling air supply outlet with at least one first cooling air inlet location of a first given notebook computer or laptop computer when it is mated with the first given notebook computer or laptop computer and such that the lid opening of a second given lid is configured to receive the movable cooling air supply outlet therein to align the movable cooling air supply outlet with at least one second cooling air inlet location of a second given notebook computer or laptop computer when it is mated with the second given notebook computer or laptop computer, the at least one first cooling air inlet location being positioned different relative to the chassis when mated with the first given notebook computer or laptop computer than the at least one second cooling air inlet location is positioned relative to the chassis when mated with the second given notebook computer or laptop computer; and wherein the system further comprises the multiple different removable and interchangeable lids.

* * * * *